(12) United States Patent
Kim et al.

(10) Patent No.: US 10,269,412 B2
(45) Date of Patent: Apr. 23, 2019

(54) MEMORY SYSTEM

(71) Applicant: SK hynix Inc., Gyeonggi-do (KR)

(72) Inventors: Hee Jun Kim, Gyeonggi-do (KR);
Minsoon Hwang, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 15/968,026

(22) Filed: May 1, 2018

(65) Prior Publication Data

US 2019/0080745 A1    Mar. 14, 2019

(30) Foreign Application Priority Data

Sep. 11, 2017   (KR) .................. 10-2017-0116025

(51) Int. Cl.
| G11C 11/4093 | (2006.01) |
| G11C 11/4096 | (2006.01) |
| G11C 11/4099 | (2006.01) |
| G11C 11/4074 | (2006.01) |
| G11C 29/50   | (2006.01) |

(52) U.S. Cl.
CPC ...... *G11C 11/4096* (2013.01); *G11C 11/4074* (2013.01); *G11C 11/4093* (2013.01); *G11C 11/4099* (2013.01); *G11C 29/50008* (2013.01)

(58) Field of Classification Search
CPC ............ G11C 11/4093; G11C 11/4096; G11C 29/50008; H03K 19/0005; H03K 19/003; H03K 19/00315; H03K 19/1776
See application file for complete search history.

(56) References Cited

U.S. PATENT DOCUMENTS

| 8,497,706 B2* | 7/2013 | Hollis ............... H03K 19/0005 |
| | | 326/30 |
| 2002/0109525 A1* | 8/2002 | Shin ................. H03K 19/00384 |
| | | 326/26 |
| 2008/0048714 A1* | 2/2008 | Lee ................... H03K 19/0005 |
| | | 326/30 |
| 2008/0122478 A1* | 5/2008 | Mei ......................... G11C 7/04 |
| | | 326/27 |
| 2008/0122510 A1* | 5/2008 | Mei ...................... G11C 7/1051 |
| | | 327/170 |
| 2011/0062984 A1* | 3/2011 | Kuwahara ............ G11C 7/1051 |
| | | 326/30 |
| 2011/0128038 A1* | 6/2011 | Ko ........................... G11C 7/02 |
| | | 326/30 |
| 2012/0072650 A1 | 3/2012 | Suzumura et al. |
| 2015/0115999 A1* | 4/2015 | Lee ............... H03K 19/017545 |
| | | 326/30 |

(Continued)

FOREIGN PATENT DOCUMENTS

KR    1020100040423    4/2010

*Primary Examiner* — Jason Crawford
(74) *Attorney, Agent, or Firm* — IP & T Group LLP

(57) ABSTRACT

A memory system includes: a buffer memory device; and a memory controller including a data output driver configured to output data to the buffer memory device, wherein the data output driver includes: a pull-up switching unit coupled to an input/output power voltage, the pull-up switching unit including a PMOS transistor controlled by a data signal that varies according to the output data; a pull-up resistor unit including an NMOS transistor coupled to a DQ pad; a pull-down switching unit controlled by the data signal; and a pull-down resistor unit coupled to the pull-down switching unit.

19 Claims, 13 Drawing Sheets

(56) References Cited

U.S. PATENT DOCUMENTS

| | | | |
|---|---|---|---|
| 2015/0255143 A1* | 9/2015 | Kuroki | H03K 19/0005 365/189.11 |
| 2016/0078909 A1* | 3/2016 | Arai | G11C 29/022 365/189.05 |
| 2017/0168746 A1* | 6/2017 | Kwon | G06F 3/0604 |
| 2017/0346466 A1* | 11/2017 | Jung | H03K 19/0005 |
| 2018/0062651 A1* | 3/2018 | Jung | H03K 19/0005 |

* cited by examiner

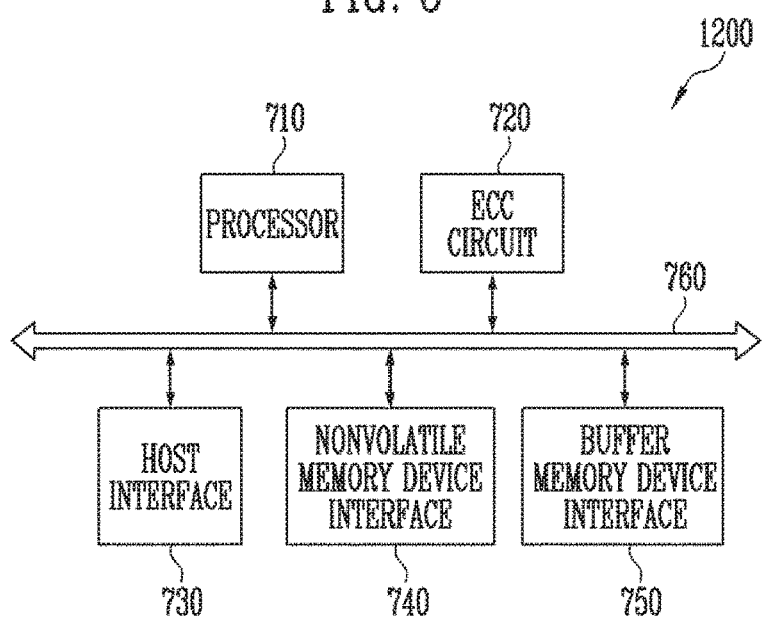
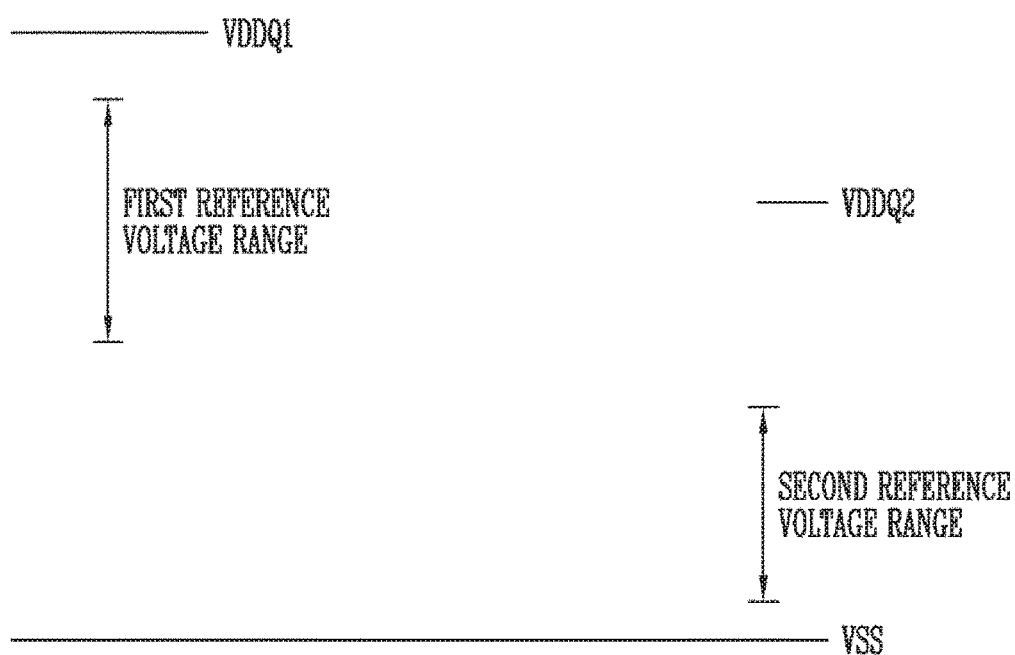

MEMORY SYSTEM

CROSS-REFERENCE TO RELATED APPLICATION

The present application claims priority under 35 U.S.C. § 119(a) to Korean patent application number 10-2017-0116025, filed on Sep. 11, 2017, the entire disclosure of which is herein incorporated by reference.

BACKGROUND

1. Field

The present invention relates generally to a memory system and, more particularly, to an improved data output driver for a memory system, and a memory system employing the data output driver.

2. Description of the Related Art

In general, a memory system may include a nonvolatile memory device, a buffer memory device, and a memory controller. The memory controller may exchange data with the buffer memory device at a high speed. When the memory controller receives data from the buffer memory device, a data signal received from an output buffer of the buffer memory device is entered to an input buffer of the memory controller. At this time, signal reflection may occur. Signal reflection is a phenomenon in which at least a portion of a data signal input to the input buffer of the memory controller is reflected to a data transmission line due to mismatching between the input impedance of the input/output terminal of the input buffer of the memory controller and the impedance of the data transmission line.

When the buffer memory device consecutively outputs a data signal, the signal reflection is not considerably problematic when the speed of the output data signal is not high. However, if the speed of the output data signal becomes greater than a certain speed, the memory controller may not stably receive the data signal due to the signal reflection. That is, there occurs a case where, a data signal received from the buffer memory device is interfered by a reflected signal of a data signal previously received from the buffer memory device. Signal reflection may also occur even when data is transmitted from buffer memory device. Typically, in order to prevent the signal reflection, an impedance calibration circuit such as an on die termination calibration circuit is provided at a data input/output terminal of the memory controller, so that the impedance of the data input/output terminal of the memory controller is matched to the impedance of the data transmission line.

SUMMARY

Various embodiments of the present invention provide a memory system including a data output driver that enables a high-speed data output operation without signal reflection or with significantly reduced signal reflection.

According to an aspect of the present disclosure, there is provided a memory system including: a buffer memory device; and a memory controller including a data output driver configured to output data to the buffer memory device, wherein the data output driver includes: a pull-up switching unit coupled to an input/output power voltage, the pull-up switching unit including a PMOS transistor controlled by a data signal that varies according to the output data; a pull-up resistor unit including an NMOS transistor coupled to a DQ pad; a pull-down switching unit controlled by the data signal; and a pull-down resistor unit coupled to the pull-down switching unit.

According to another aspect of the present disclosure, there is provided a memory system including: a buffer memory device including at least one DRAM; and a memory controller, wherein the memory controller includes: a data output driver configured to output data to the DRAM; a reference voltage generating unit configured to generate a reference voltage and change the level of the reference voltage, based on a mode selection signal; and a pull-up calibration circuit configured to generate a high voltage pull-up code, based on the reference voltage, wherein the data output driver includes: a pull-up switching unit coupled to an input/output power voltage, the pull-up switching unit including a PMOS transistor controlled by a data signal that varies according to data; a pull-up resistor unit including a plurality of NMOS transistors, the pull-up resistor unit being coupled between a DQ pad and the pull-up switching unit, the pull-up resistor unit determining whether each of the plurality of NMOS transistors is turned on, based on the high voltage pull-up code; a pull-down switching unit controlled by the data signal; and a pull-down resistor unit coupled to the pull-down switching unit.

According to yet another aspect of the present disclosure, there is provided a data output driver including: a pull-up switching unit coupled to an input/output power voltage, the pull-up switching unit including a PMOS transistor controlled by a data signal that varies according to data; a pull-up resistor unit including a plurality of NMOS transistors coupled between a DQ pad and the pull-up switching unit; a pull-down switching unit controlled by the data signal; and a pull-down resistor unit coupled to the pull-down switching unit.

These and other features and advantages of the present invention will become apparent to those with ordinary skill in the art to which the present invention belongs from the following description in conjunction with the accompanying drawings.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

FIG. 5 is a diagram illustrating a memory controller shown in FIG. 1.

FIG. 6 is a diagram illustrating an exemplary range of a reference voltage for a data input/output operation.

DETAILED DESCRIPTION

In the following detailed description, only certain exemplary embodiments of the present disclosure have been shown and described, simply by way of illustration. As those skilled in the art would realize, the described embodiments may be modified in various different ways, all without departing from the spirit or scope of the present disclosure. Accordingly, the drawings and description are to be regarded as illustrative in nature and not restrictive.

In the entire specification, when an element is referred to as being "connected" or "coupled" to another element, it can be directly connected or coupled to the another element or be indirectly connected or coupled to the another element with one or more intervening elements interposed therebetween. In addition, when an element is referred to as "including" a component, this indicates that the element may further include another component instead of excluding another component unless there is different disclosure.

The terminology used herein is for the purpose of describing particular embodiments only and is not intended to be limiting of the present invention. As used herein, singular forms are intended to include the plural forms as well, unless the context clearly indicates otherwise.

Figure 1:
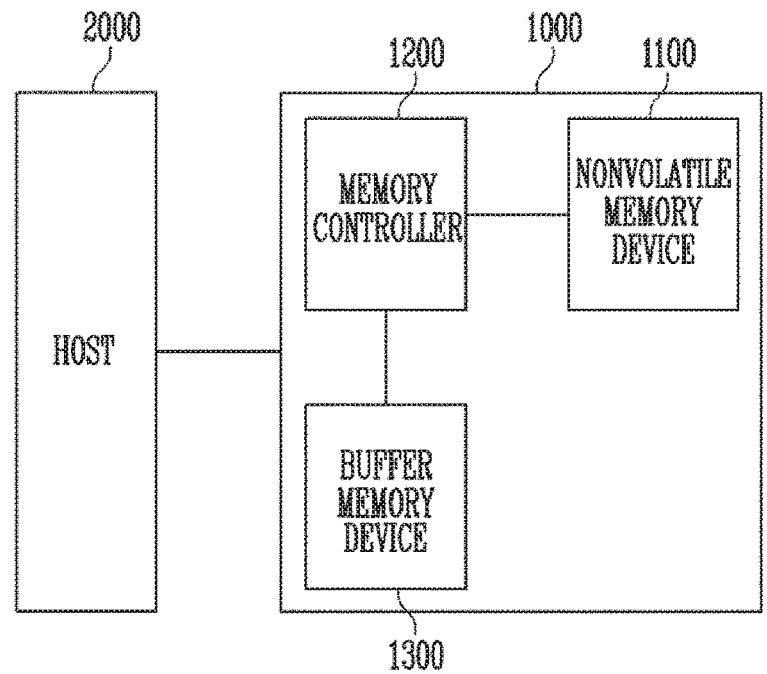
FIG. 1 is a diagram illustrating a memory system in accordance with an embodiment of the present disclosure.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention. FIG. 1 is a diagram illustrating a memory system 1000 operatively coupled to a host 2000, in accordance with an embodiment of the present disclosure.

Referring to FIG. 1, the memory system 1000 may include a nonvolatile memory device 1100 that retains stored data even when power is cut off, a buffer memory device 1300 for temporarily storing data, and a memory controller 1200 for controlling the nonvolatile memory device 1100 and the buffer memory device 1300 under the control of the host 2000.

The host 2000 may communicate with the memory system 1000, using at least one of various communication manners, such as a universal serial bus (USB), a serial AT attachment (SATA), a high speed interchip (HSIC), a small computer system interface (SCSI), Firewire, a peripheral component interconnection (PCI), a PCI express (PCIe), a nonvolatile memory express (NVMe), a universal flash storage (UFS), a secure digital (SD), a multimedia card (MMC), an embedded MMC (eMMC), a dual in-line memory module (DIMM), a registered DIMM (RDIMM), a load reduced DIMM (LRDIMM), and the like.

The memory controller 1200 may control overall operations of the memory system 1000, and control data exchange between the host 2000 and the nonvolatile memory device 1100. For example, the memory controller 1200 may program or read data by controlling the nonvolatile memory device 1100 in response to a request of the host 2000. Also, the memory controller 1200 may store information of main memory blocks and sub-memory blocks, which are included in the nonvolatile memory device 1100, and select to perform a program operation on a main memory block or a sub-memory block of the nonvolatile memory device 1100 according to the amount of data loaded for the program operation. In some embodiments, the nonvolatile memory device 1100 may be or include a flash memory.

The memory controller 1200 may control data exchange between the host 2000 and the buffer memory device 1300 or temporarily store system data for controlling the nonvolatile memory device 1100 in the buffer memory device 1300. The buffer memory device 1300 may be used as a working memory, a cache memory, or a buffer memory of the memory controller 1200. The buffer memory device 1300 may store codes and commands, which are executed by the memory controller 1200. Also, the buffer memory device 1300 may store data processed by the memory controller 1200.

The memory controller 1200 may temporarily store data received from the host 2000 in the buffer memory device 1300 and then transmit the temporarily stored data from the buffer memory device 1300 to be stored in the nonvolatile memory device 1100. Also, the memory controller 1200 may receive data and a logical address, which are received from the host 2000, and transform the logical address to a physical address indicating a region in which data is to be actually stored in the nonvolatile memory device 1100. Also, the memory controller 1200 may store, in the buffer memory device 1300, a logical-to-physical address mapping table that establishes a mapping relationship between the logical address and the physical address.

In some embodiments, the buffer memory device 1300 may include a double data rate synchronous dynamic random-access memory (DDR SDRAM), a low power double data rate 4 (LPDDR4) SDRAM, a graphics double data rate (GDDR) SRAM, a low power DDR (LPDDR), a rambus dynamic random-access memory (RDRAM), etc.

Figure 2:
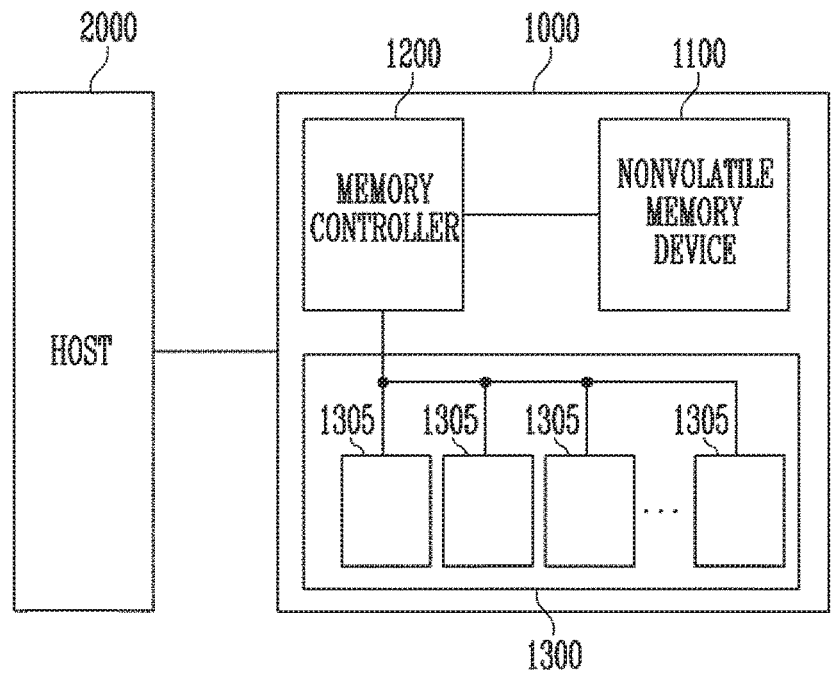
FIG. 2 is a diagram illustrating a memory system in accordance with an embodiment of the present disclosure.

FIG. 2 is a diagram illustrating a memory system in accordance with an embodiment of the present disclosure.

Referring to FIG. 2, the buffer memory device 1300 may be configured in the form of a module including one or more DRAMs 1305. The DRAMs 1305 may exchange data signals with the memory controller 1200 by sharing the same data transmission line. Here, the DRAM may be DDR4 SDRAM.

When a data signal received from the DRAM 1305 is entered to an input buffer of the memory controller 1200, signal reflection may occur. The signal reflection refers to a phenomenon in which a portion of a data signal input to the input buffer of the memory controller is reflected to the data transmission line due to the mismatching between the input impedance of the input/output terminal in the input buffer of the memory controller and the impedance of the data transmission line. An impedance calibration operation may be required to prevent data signal distortion caused by the signal reflection.

Figure 3:
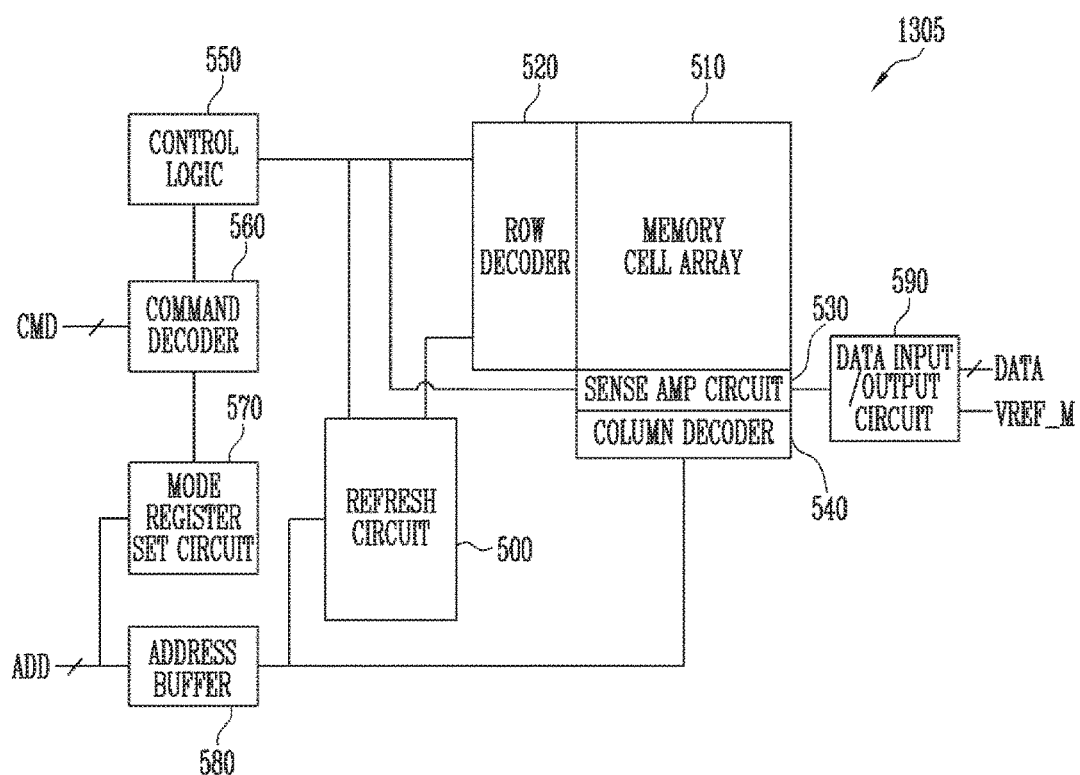
FIG. 3 is a diagram illustrating a DRAM shown in FIG. 2.

FIG. 3 is a diagram illustrating an exemplary configuration of the DRAM of FIG. 2.

Referring to FIG. 3, the DRAM 1305 may include a memory cell array 510, a row decoder 520, a sense amp circuit 530, a column decoder 540, a control logic 550, a command decoder 560, a mode register set (MRS) circuit 570, an address buffer 580, a data input/output circuit 590, and a refresh circuit 500.

The memory cell array 510 is a data storage in which a lot of memory cells are arranged in row and column directions. The memory cell array 510 includes a plurality of DRAM memory cells, and data stored in the DRAM memory cell may disappear when power is cut off. The sense amp circuit 530 may read data stored in the memory cell array 510 by sensing and amplifying a voltage difference between a bit line pair, based on the distribution of charges stored in a selected memory cell.

Data DATA entered through the data input/output circuit 590 is written in a memory region of the memory cell array 510 according to an address signal ADD. The data DATA read from the memory cell array 510 based on the address signal ADD is transmitted to an external or host device through the data input/output circuit 590. The address signal ADD is entered to the address buffer 580 to designate a memory region or location in the memory cell array in or from which data is to be written or read. The address buffer 580 temporarily stores the address signal ADD received from the external or host device.

The data input/output circuit 590 may receive a reference voltage from an external or host device through a memory reference voltage pad VREF_M. The reference voltage may be used as a reference for determining whether a data signal is logic 'high' or logic 'low' when data is entered to the DRAM 1305.

The row decoder 520 decodes a row address in the address signal ADD received from the address buffer 580 for designating a word line coupled to a memory cell to or from which data is to be transmitted. For example, the row decoder 120 may enables a corresponding word line by decoding the row address received from the address buffer 580 in a data write or read mode.

The column decoder 540 decodes a column address in the address signal ADD received from the address buffer 580 for designating a bit line coupled to a memory cell to or from which data is to be transmitted.

The command decoder 560 receives a command signal CMD applied from the external or host device, and decodes the command signal CMD to generate an internal decoded command signal. The MRS circuit 570 sets an internal mode register in response to the address signal ADD and an MRS command for designating an operation mode of the DRAM 1305. The control logic 550 may control an operation of the DRAM 1305 in response to a command received from the command decoder 560.

The refresh circuit 500 may control a refresh operation of reading data stored in preparation for a case where charges stored in a capacitor of each of the DRAM memory cells included in the memory cell array 510 disappear and then re-writing the read data.

In addition, although not shown in FIG. 3, the DRAM 1305 may further include other devices which are well known in the art. For example, the DRAM 1305 may include a clock circuit for generating a clock signal, and a power circuit for generating an internal voltage by dividing a power voltage applied from the external or host device.

Figure 4:
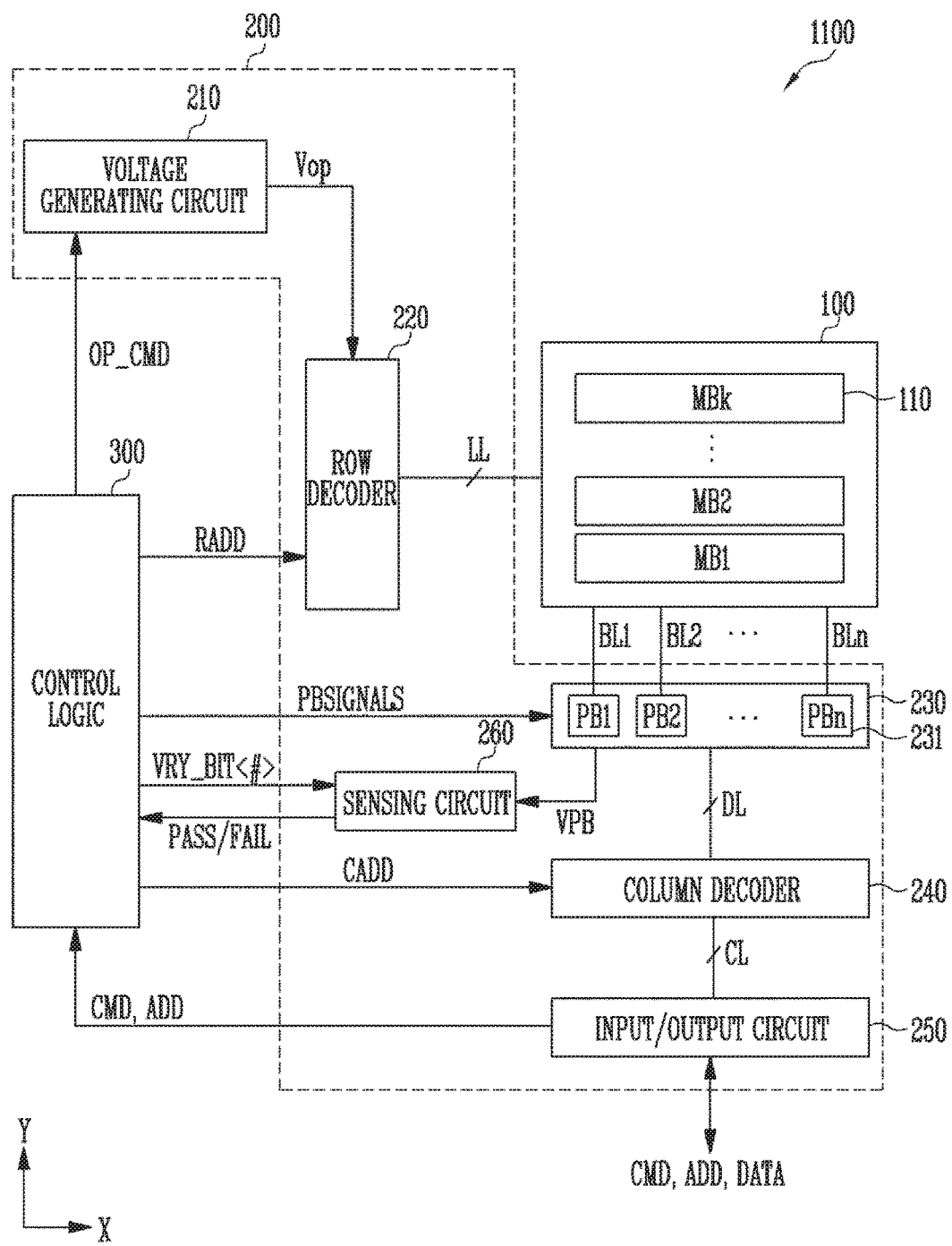
FIG. 4 is a diagram illustrating a nonvolatile memory device shown in FIG. 1.

FIG. 4 is a diagram illustrating an exemplary configuration of the nonvolatile memory device of FIG. 1.

Referring to FIG. 4, the nonvolatile memory device 1100 may include a memory cell array 100 for storing data. The nonvolatile memory device 1100 may include peripheral circuits 200 configured to perform an operation including, for example, a program operation for storing data in the memory cell array 100, a read operation for outputting the stored data, and an erase operation for erasing the stored data. The nonvolatile memory device 1110 may include a control logic 300 for controlling the peripheral circuits 200 under the control of the memory controller (1200 of FIG. 1). In an embodiment, the memory cell array 100 may include a plurality of NAND flash memory cells, and data stored in the NAND flash memory cell may not disappear when power is cut off.

The memory cell array 100 may include a plurality of memory blocks MB1 to MBk (k is a positive integer) 110. Local lines LL and bit lines BL1 to BLn (n is a positive integer) may be coupled to the memory blocks MB1 to MBk 110. For example, the local lines LL may include a first select line, a second select line, and a plurality of word lines arranged between the first and second select lines. Also, the local lines LL may further include dummy lines arranged between the first select line and the word lines and between the second select line and the word lines. Here, the first select line may be a source select line, and the second select line may be a drain select line. For example, the local lines LL may include word lines, drain and source select lines, and source lines SL. For example, the local lines LL may further include dummy lines. For example, the local lines LL may further include pipe lines. The local lines LL may be coupled to the memory blocks MB1 to MBk 110, respectively, and the bit lines BL1 to BLn may be commonly coupled to the memory blocks MB1 to MBk 110. The memory blocks MB1 to MBk 110 may be implemented in a two-dimensional or three-dimensional structure. For example, memory cells may be arranged in a direction parallel to a substrate in memory blocks 110 having a two-dimensional structure. For example, memory cells may be arranged in a direction vertical to a substrate in memory blocks 110 having a three-dimensional structure.

The peripheral circuits 200 may be configured to perform program, read, and erase operations of a selected memory block 110 under the control of the control logic 300. For example, the peripheral circuits 200, under the control of the control logic 300, may supply verify and pass voltages to the first select line, the second select line, and the word lines, selectively discharge the first select line, the second select line, and the word lines, and verify memory cells coupled to a selected word line among the word lines. For example, the peripheral circuits 200 may include a voltage generating circuit 210, a row decoder 220, a page buffer group 230, a column decoder 240, an input/output circuit 250, and a sensing circuit 260.

The voltage generating circuit 210 may generate various operating voltages Vop used for the program, read, and erase operations in response to an operation signal OP_CMD. Also, the voltage generating circuit 210 may selectively discharge the local lines LL in response to the operation signal OP_CMD. For example, the voltage generating circuit 210 may generate a program voltage, a verify voltage, pass voltages, a turn-on voltage, a read voltage, an erase voltage, a source line voltage, and the like under the control of the control logic 300.

The row decoder 220 may transfer the operating voltages Vop to local lines LL coupled to a selected memory block 110 in response to a row address RADD.

The page buffer group 230 may include a plurality of page buffers PB1 to PBn 231 coupled to the bit lines BL1 to BLn. The page buffers PB1 to PBn 231 may operate in response to page buffer control signals PBSIGNALS. For example, the page buffers PB1 to PBn 231 may temporarily store data received through the bit lines BL1 to BLn, or sense voltages or current of the bit lines BL1 to BLn in a read or verify operation.

The column decoder 240 may transfer data between the input/output circuit 250 and the page buffer group 230 in response to a column address CADD. For example, the column decoder 240 may exchange data with the page buffers 231 through data lines DL, or exchange data with the input/output circuit 250 through column lines CL.

The input/output circuit 250 may transfer a command CMD and address ADD, which are received from the memory controller (1200 of FIG. 1), to the control logic 300, or exchange data DATA with the column decoder 240.

The sensing circuit 260, in a read operation and a verify operation, may generate a reference current in response to a permission bit VRY_BIT<#>, and output a pass signal PASS or a fail signal FAIL by comparing a sensing voltage VPB received from the page buffer group 230 with a reference voltage generated by the reference current.

The control logic 300 may control the peripheral circuits 200 by outputting the operation signal OP_CMD, the row address RADD, the column address CADD, the page buffer control signals PBSIGNALS, and the permission bit VRY_BIT<#> in response to the command CMD and the address ADD received from the input/output circuit 250. Also, the control logic 300 may determine whether the verify operation has passed or failed in response to the pass or fail signal PASS or FAIL.

FIG. 5 is a diagram illustrating an exemplary configuration of the memory controller of FIG. 1.

Referring to FIG. 5, the memory controller 1200 may include a processor 710, an error correction code (ECC) circuit 720, a host interface 730, a nonvolatile memory device interface 740, a buffer memory device interface 750, and a bus 760.

The bus 760 may be configured to provide a communication channel between the components of the memory controller 1200. The bus 760 may include one or more communication lines.

The processor 710 may control the overall operations of the memory controller 1200. The processor 710 may perform a logical operation. The processor 710 may communicate with the host 2000 through the host interface 730, and communicate with the nonvolatile memory device 1100 through the nonvolatile memory device interface 740. Also, the processor 710 may communicate with the memory buffer device 1300 through the buffer memory device interface 750.

The ECC circuit 720 may perform an ECC operation. The ECC circuit 720 may perform ECC encoding on data to be written in the nonvolatile memory device 1100 through the nonvolatile memory device interface 740. The ECC encoded data may be transferred to the nonvolatile memory device 1100 through the nonvolatile memory device interface 740. The ECC circuit 720 may perform ECC decoding on data received from the nonvolatile memory device 1100 through the nonvolatile memory device interface 740. In an embodiment, the ECC circuit 720 may be included as a component of the nonvolatile memory device interface 740 in the nonvolatile memory device interface 740.

The host interface 730 is configured to communicate with the host 2000 under the control of the processor 710. The host interface 730 may be configured to communicate with the host 2000, using at least one of various communication manners, such as a universal serial bus (USB), a serial AT attachment (SATA), a high speed interchip (HSIC), a small computer system interface (SCSI), Firewire, a peripheral component interconnection (PCI), a PCI express (PCIe), a nonvolatile memory express (NVMe), a universal flash storage (UFS), a secure digital (SD), a multimedia card (MMC), an embedded MMC (eMMC), a dual in-line memory module (DIMM), a registered DIMM (RDIMM), and a load reduced DIMM (LRDIMM).

The nonvolatile memory device interface 740 is configured to communicate with the nonvolatile memory device 1100 under the control of the processor 710. The nonvolatile memory device interface 740 may communicate a command, an address, and data with the nonvolatile memory device 1100 through a channel.

In an embodiment, the processor 710 may control an operation of the memory controller 1200, using various codes. The processor 710 may load codes from a read only memory (ROM) provided inside the memory controller 1200. In another embodiment, the processor 710 may load codes from the nonvolatile memory device 1100 through the nonvolatile memory device interface 740.

In an embodiment, the bus 760 of the memory controller 1200 may be divided into a control bus and a data bus. The data bus may be configured to transmit data in the memory controller 1200. The control bus may be configured to transmit control information such as a command and an address in the memory controller 1200. The data bus and the control bus are separated from each other, and may not interfere or influence with each other. The data bus may be coupled to the host interface 730, the ECC circuit 720, the nonvolatile memory device interface 740, and the buffer memory device interface 750. The control bus may be coupled to the host interface 730, the processor 710, the nonvolatile memory device interface 740, and the buffer memory device interface 750.

The buffer memory device interface 750 may be configured to communicate with the buffer memory device 1300 under the control of the processor 710. The buffer memory device interface 750 may communicate a command, an address, and data with the buffer memory device 1300 through a channel.

FIG. 6 is a diagram illustrating an exemplary range of a reference voltage for a data input/output operation.

Referring to FIG. 6, the reference voltage Vref for the data input/output operation may have different voltage ranges depending on termination directions.

The memory controller 1200 and the buffer memory device 1300 may perform a data input or output operation, based on a first input/output power voltage VDDQ1. For example, the first input/output power voltage VDDQ1 may have a voltage level of about 1.2 V. In another embodiment, the memory controller 1200 and the buffer memory device 1300 may perform a data input or output operation, based on a second input/output power voltage VDDQ2. For example, the second input/output power voltage VDDQ2 may have a voltage level of about 0.8 V. In an embodiment, in the case of a DDR4 DRAM, the DDR4 DRAM may perform a data input or output operation, based on an input/output power voltage (i.e., the first input/output power voltage VDDQ1) having a voltage level of about 1.2 V. In another embodiment, in the case of an LPDDR4 DRAM, the LPDDR4 DRAM may perform a data input or output operation, based on an input/output power voltage (i.e., the second input/output power voltage VDDQ2) having a voltage level of about 0.8 V. In other words, the LPDDR4 DRAM may operate at a lower input/output power voltage as compared with the DDR4 DRAM.

In the case of the memory system 1000 using the DDR4 DRAM as the DRAM 1305 included in the buffer memory device 1300, the buffer memory device interface 750 of the memory controller 1200 may also perform a data input or output operation, based on the first input/output power voltage VDDQ1. Also, in the case of the memory system 1000 using the LPDDR4 DRAM as the DRAM 1305 included in the buffer memory device 1300, the buffer memory device interface 750 of the memory controller 1200 may perform a data input or output operation, based on the second input/output power voltage VDDQ2. The buffer memory device interface 750 of the memory controller 1200 may operate at both of the first input/output power voltage VDDQ1 and the second input/output power voltage VDDQ2. This is advantageous because when designing the memory controller 1200 for the memory system 1000, it is no longer necessary to determine in advance which type of DRAM is to be used for the buffer memory device 1300 in the memory device 1000.

Also, the termination direction may differ depending on the kind of the DRAM 1305 included in the buffer memory device 1300. In an embodiment, the termination directions of the DDR4 DRAM and the LPDDR4 DRAM may be opposite to each other. The reference voltage Vref for the data input/output operation may have different voltage ranges depending on the termination directions. In an embodiment, when the memory system 1000 has a calibration resistor that is terminated to an input/output power voltage VDDQ, the range of the reference voltage Vref for the data input/output operation may be formed closer to the input/output power voltage VDDQ than a ground voltage VSS. In another embodiment, when the memory system 1000 has a calibration resistor that is terminated to the ground voltage VSS, the range of the reference voltage Vref for the data input/output operation may be formed closer to the ground voltage VSS than the input/output power voltage VDDQ.

In the case of the DDR4 DRAM, the calibration resistor may be terminated to the input/output power voltage VDDQ. As a result, the reference voltage Vref may be included in a first reference voltage range closer to the first input/output power voltage VDDQ1 than the ground voltage VSS. In the case of the LPDDR4 DRAM, the calibration resistor may be terminated to the ground voltage VSS. As a result, the reference voltage Vref may be included in a second reference voltage range closer to the ground voltage VSS than the second input/output power voltage VDDQ2. In accordance with an embodiment of the present invention, designing the memory controller 1200 in the memory system 1000, may include designing the buffer memory device interface 750 of the memory controller 1200 to generate the reference voltage Vref at which the buffer memory device 750 of the memory controller 1200 is operable in both of the first reference voltage range and the second reference voltage range, i.e., for both the DDR4 DRAM and the LPDDR4 DRAM.

Figure 7:
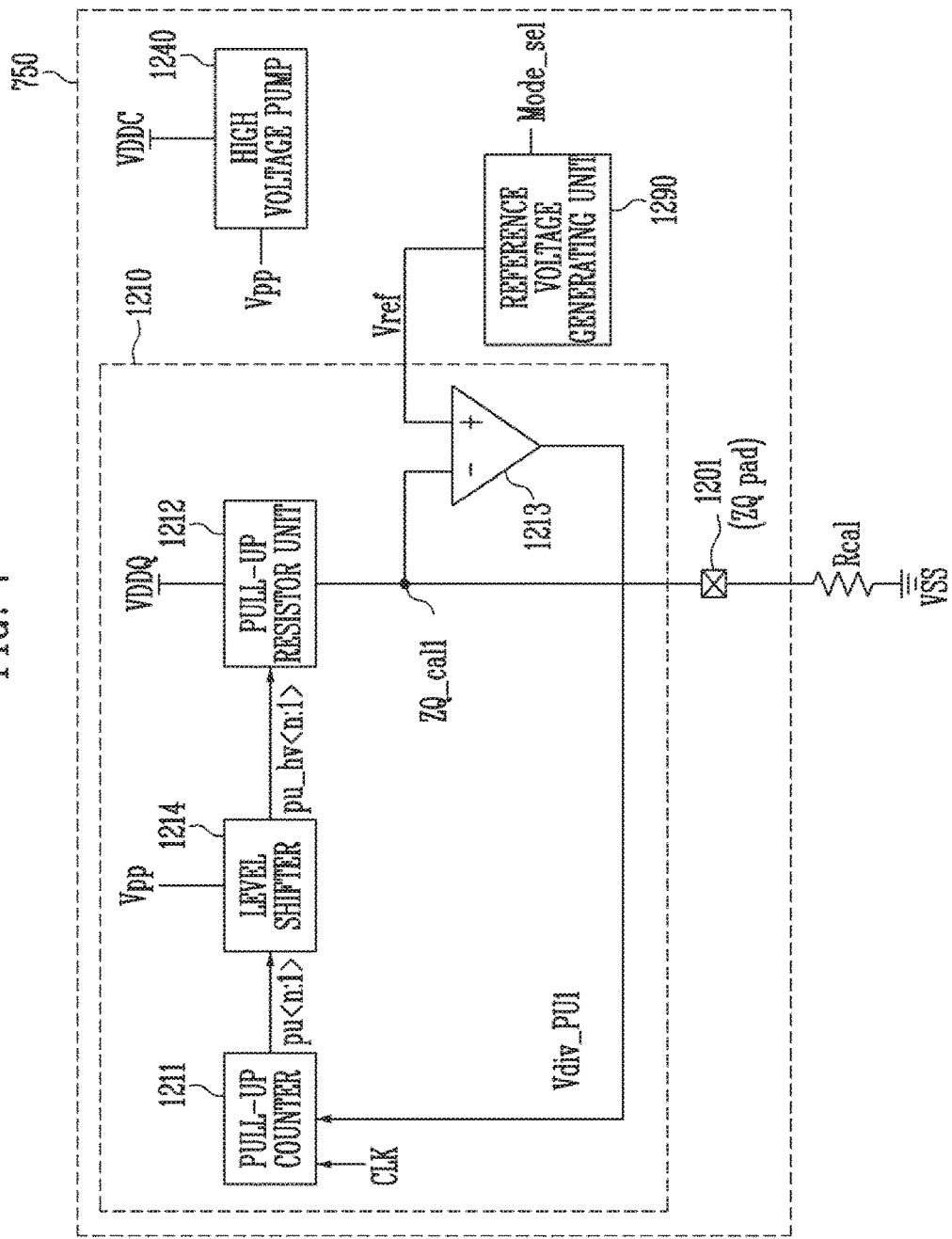
FIG. 7 is a diagram illustrating a pull-up impedance calibration operation in accordance with an embodiment of the present disclosure.

FIG. 7 is a diagram illustrating a pull-up impedance calibration operation in accordance with an embodiment of the present disclosure.

Referring to FIG. 7, the buffer memory device interface 750 of the memory controller 1200 may include a first pull-up impedance calibration circuit 1210 and a reference voltage generating unit 1290 for generating a reference voltage Vref. The first pull-up impedance calibration circuit 1210 may include a pull-up counter 1211 for generating a pull-up code pu<n:1> in response to the reference voltage Vref generated by the reference voltage generating unit 1290, a level shifter 1214 that increases a voltage swing of the pull-up code pu<n:1>, a pull-up resistor unit 1212 that changes the resistance of a pull-up resistor, and a comparator 1213.

A calibration resistor Rcal may be located externally of the memory controller 1200. One node of the calibration resistor Rcal may be coupled to the memory controller 1200 through a ZQ pad 1201 of the memory controller 1200, and the other node of the calibration resistor Rcal may be coupled to ground voltage VSS.

The reference voltage generating unit 1290 may generate a reference voltage Vref for a ZQ calibration operation. The ZQ calibration operation may include a pull-up impedance calibration operation and a pull-down impedance calibration operation. The reference voltage generating unit 1290 may change the level of the reference voltage Vref in response to a mode selection signal Mode_sel. In an embodiment, when the buffer memory device 1300 uses the DDR4 DRAM as the DRAM 1305, the reference voltage generating unit 1290 may generate the reference voltage Vref having a level included in the first reference voltage range of FIG. 6. In another embodiment, when the buffer memory device 1300 uses the LPDDR4 DRAM as the DRAM 1305, the reference voltage generating unit 1290 may generate the reference voltage Vref having a level included in the second reference voltage range of FIG. 6. As described above, the reference voltage Vref may have different levels depending on the kind of the DRAM 1305 included in the buffer memory device 1300, and the reference voltage generating unit 1290 may allow the level of the reference voltage Vref to be changed in response to the mode selection signal Mode_sel. In an embodiment, when the buffer memory device 1300 uses the DDR4 DRAM as the DRAM 1305, the mode selection signal Mode_sel may be logic 'high.' When the buffer memory device 1300 uses the LPDDR4 DRAM as the DRAM 1305, the mode selection signal Mode_sel may be logic 'low.'

An external device of the memory controller 1200, e.g., the buffer memory device 1300 may use the reference voltage Vref generated by the memory controller 1200 in a data input operation. For example, the reference voltage Vref may be used as a voltage that becomes a reference for determining whether a data signal is logic 'high' or logic 'low' in a data input or output operation between the memory controller 1200 and the buffer memory device 1300.

The reference voltage Vref may be entered as a first input of the comparator 1213. A second input of the comparator 1213 may be coupled to a first ZQ calibration node ZQ_cal1. The comparator 1213 may generate a first pull-up division voltage Vdiv_PU1 by comparing the reference voltage Vref with a voltage of the first ZQ calibration node ZQ_cal1.

The first pull-up division voltage Vdiv_PU1 and a clock signal CLK may be entered to the pull-up counter 1211. The pull-up counter 1211 may change a value of the pull-up code pu<n:1>, based on the first pull-up division voltage Vdiv_PU1. At this time, the pull-up counter 1211 may change the value of the pull-up code pu<n:1> in synchronization with the clock signal CLK. The voltage swing of the pull-up code pu<n:1> may have the magnitude of an input/output power voltage VDDQ. Here, n may be a natural number of 2 or more.

The level shifter 1214 may generate a high voltage pull-up code pu_hv<n:1> by increasing the magnitude of the voltage swing of the pull-up code pu<n:1>. As described above, the voltage swing of the pull-up code pu<n:1> may have the magnitude of the input/output power voltage VDDQ. The level shifter 1214 may allow the magnitude of the voltage swing of the pull-up code pu<n:1> to be increased from the input/output power voltage VDDQ to a high voltage Vpp. The high voltage Vpp may be a voltage higher than the input/output power voltage VDDQ. The high voltage Vpp may be generated by a high voltage pump 1240. The high voltage pump 1240 may generate the high voltage Vpp by pumping charges supplied from an internal power voltage VDDC. In other words, the high voltage pump 1240 may use the internal power voltage VDDC rather than the input/output power voltage VDDQ when a charge pumping operation is performed. As a result, the high voltage Vpp can be stably generated regardless of noise generated in the input/output power voltage VDDQ when a data input/output operation is performed. In addition, when the high voltage pump 1240 performs the charge pumping operation, noise in the internal power voltage VDDC generated when the charge pumping operation is performed using the internal power voltage VDDC rather than the input/output power voltage VDDQ may have no influence on the data input/output operation. In another embodiment, the pull-up code pu<n:1> received from the pull-up counter 1211 is not entered to the level shifter 1214 but is entered immediately to the pull-up resistor unit 1212.

The input/output power voltage VDDQ may be supplied from an external or host device to the memory controller 1200 through an input/output power voltage pad (VDDQ pad: not shown). In addition, the internal power voltage VDDC may be supplied from an external or host device to the memory controller 1200 through an internal power voltage pad (VDDC pad: not shown) different from the VDDQ pad. As the VDDQ pad through which the input/output power voltage VDDQ is supplied and the VDDC pad through which the internal power voltage VDDC is supplied are separated from each other, it is possible to minimize malfunction caused in an internal operation of the memory controller 1200 due to power noise generated in a data output operation of the memory controller 1200. In addition, it is possible to minimize malfunction caused in the data output operation of the memory controller 1200 due to power noise generated in the internal operation of the memory controller 1200.

The pull-up resistor unit 1212 may change the resistance of the pull-up resistor, based on a value of the high voltage pull-up code pu_hv<n:1>. If the resistance of the pull-up resistor varies, the voltage of the first ZQ calibration node ZQ_cal1 may vary.

In an embodiment, when the voltage of the first ZQ calibration node ZQ_cal1 is higher than the reference voltage Vref, the pull-up counter 1211 may change the value of the pull-up code pu<n:1> in synchronization with the clock signal CLK such that the resistance of the pull-up resistor of the pull-up resistor unit 1212 increases. The pull-up resistor unit 1212 may increase the resistance of the pull-up resistor in response to the high voltage pull-up code pu_hv<n:1> received from the level shifter 1214. As a result, the voltage of the first ZQ calibration node ZQ_cal1 may decrease.

In an embodiment, when the voltage of the first ZQ calibration node ZQ_cal1 is lower than the reference voltage Vref, the pull-up counter 1211 may change the value of the pull-up code pu<n:1> in synchronization with the clock signal CLK such that the resistance of the pull-up resistor of the pull-up resistor unit 1212 decreases. The pull-up resistor unit 1212 may decrease the resistance of the pull-up resistor in response to the high voltage pull-up code pu_hv<n:1> received from the level shifter 1214. As a result, the voltage of the first ZQ calibration node ZQ_cal1 may increase. In addition, the voltage of the first ZQ calibration node ZQ_cal1 may be changed depending on the resistance of the calibration resistor Rcal. In other words, the pull-up resistor unit 1212 may change the resistance of the pull-up resistor depending on the resistance of the calibration resistor Rcal. In an embodiment, when the reference voltage Vref has a level that is a half of the input/output power voltage VDDQ, the resistance of the pull-up resistor of the pull-up resistor unit 1212 may be set equal to that of the calibration resistor Rcal.

According to the pull-up impedance calibration operation described above, the voltage of the first ZQ calibration node ZQ_cal1 may be set equal to or substantially equal to the reference voltage Vref. The pull-up impedance calibration operation may be performed in a power-up operation. The pull-up impedance calibration operation may be performed in response to an external request. Also, the pull-up impedance calibration operation may be performed in real time in a state in which the input/output power voltage VDDQ is applied. When the pull-up impedance calibration operation is performed in real time, it is possible to counteract, in real time, a change in input/output power voltage VDDQ, temperature, or the like.

Figure 8:
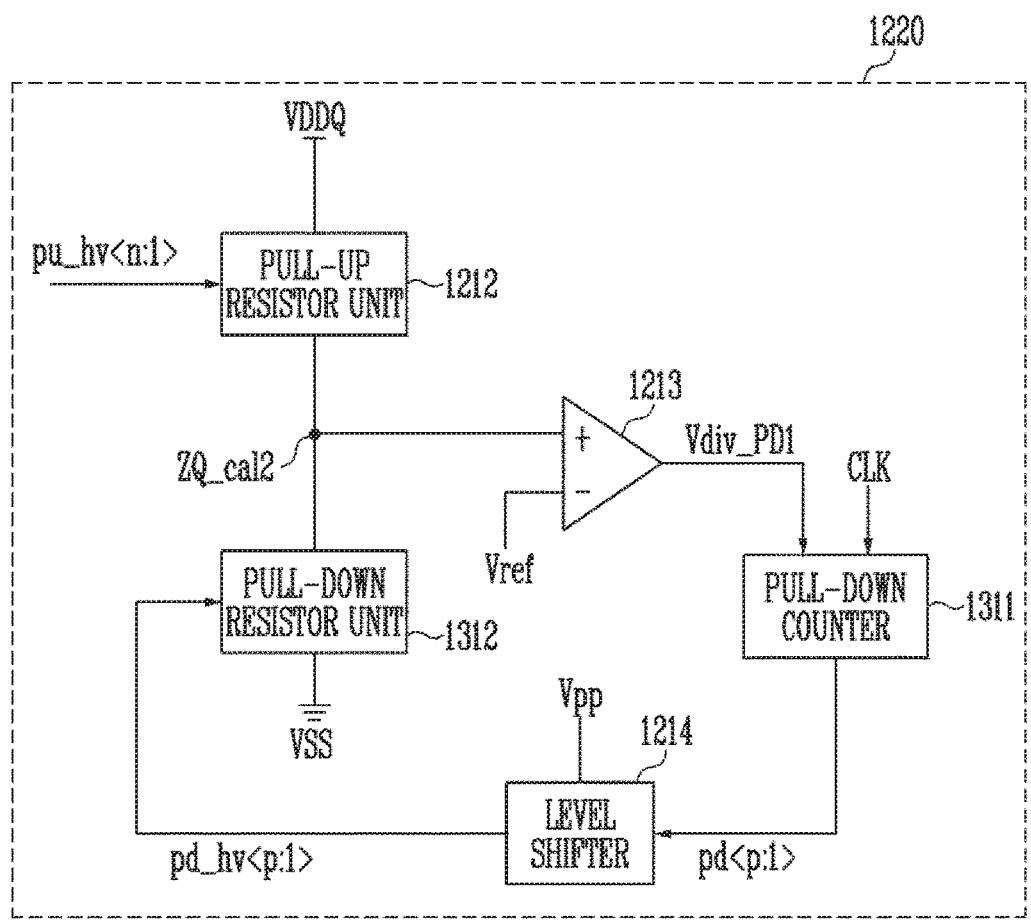
FIG. 8 is a diagram illustrating a pull-down impedance calibration operation in accordance with an embodiment of the present disclosure.

FIG. 8 is a diagram illustrating a pull-down impedance calibration operation in accordance with an embodiment of the present disclosure.

Referring to FIG. 8, the buffer memory device 750 of the memory controller 1200 may include a first pull-down impedance calibration circuit 1220. The memory controller 1200 may perform a pull-down impedance calibration operation, based on the high voltage pull-up code pu_hv<n:1> set by the pull-up impedance calibration operation described with reference to FIG. 7. In order to perform the pull-down impedance calibration operation, the first pull-down impedance calibration circuit 1220 may include the pull-up resistor unit 1212, the comparator 1213 configured to compare the reference voltage Vref with a voltage of a second ZQ calibration node ZQ_cal2, a pull-down counter 1311 configured to generate a pull-down code pd<p:1>, based on a first pull-down division voltage Vdiv_PD1 generated by the comparator 1213, the level shifter 1214 configured to increase the magnitude of a voltage swing of the pull-down code pd<p:1>, and a pull-down resistor unit 1312 configured to change the resistance of a pull-down resistor in response to a high voltage pull-down code pd_hv<p:1>.

The high voltage pull-up code pu_hv<n:1> of FIG. 8 may be a value determined through the pull-up impedance calibration operation described with reference to FIG. 7. Consequently, the resistance value of the pull-up resistor of the pull-up resistor unit 1212 of FIG. 8 may also be determined through the pull-up impedance calibration operation described with reference to FIG. 7. In addition, the reference voltage Vref of FIG. 8 may be equal to the reference voltage Vref of FIG. 7. In another embodiment, instead of the high voltage pull-up code pu_hv<n:1>, the pull-up code pu<n:1> generated by the pull-up counter 1211 of FIG. 7 may be immediately entered to the pull-up resistor unit 1212 of FIG. 8.

In an embodiment, the pull-down resistor of the pull-down resistor unit 1312 may have a very large value before the pull-down calibration operation is started. In this case, the voltage of the second ZQ calibration node ZQ_cal2 may be higher than the reference voltage Vref. The comparator 1213 may generate a first pull-down division voltage Vdiv_PD1 by comparing the voltage of the second ZQ calibration node ZQ_cal2 with the reference voltage Vref, and the pull-down counter 1311 may generate a pull-down code pd<p:1> in response to the first pull-down division voltage Vdiv_PD1. The voltage swing of the pull-down code pd<p:1> may have the magnitude of an input/output power voltage VDDQ. At this time, the value of the pull-down code pd<p:1> may vary such that the resistance of the pull-down resistor of the pull-down resistor unit 1312 decreases. Here, p may be a natural number of 2 or more.

The level shifter 1214 may generate the high voltage pull-down code pd_hv<p:1> by increasing the magnitude of the voltage swing of the pull-down code pd<p:1> from the input/output power voltage VDDQ to a high voltage Vpp. The high voltage Vpp may be higher than the input/output power voltage VDDQ. The high voltage Vpp may be generated by the high voltage pump 1240 of FIG. 7.

The pull-down resistor unit 1312 may change the resistance of the pull-down resistor in response to the high voltage pull-down code pd_hv<p:1> generated by the level shifter 1214. In the above-described example, the pull-down resistor unit 1312 may decrease the resistance of the pull-down resistor in response to the high voltage pull-down code pd_hv<p:1> generated by the level shifter 1214. As a result, the voltage of the second ZQ calibration node ZQ_cal2 may decrease.

In another embodiment, when the voltage of the second ZQ calibration node ZQ_cal2 is lower than the reference voltage Vref, the pull-down counter 1311 may change the pull-down code pd<p:1> to increase the resistance of the pull-down resistor of the pull-down resistor unit 1312. In addition, the pull-down resistor unit 1312 may increase the resistance of the pull-down resistor in response to the changed pull-down code pd<p:1>, thus increasing the voltage of the second ZQ calibration node ZQ_cal2. Consequently, the pull-down code pd<p:1> may be set to a code value that allows the voltage of the second ZQ calibration node ZQ_cal2 to be equal to the reference voltage Vref.

As described with reference to FIG. 7, the memory controller 1200 may determine the pull-up code pu<n:1>, based on the reference voltage Vref and the resistance of the calibration resistor Rcal, and the resistance of the pull-up resistor of the pull-up resistor unit 1212 may be determined based on the determined pull-up code pu<n:1>. Also, the memory controller 1200 may perform the pull-down impedance calibration operation, based on the pull-up code pu<n:1> determined through the pull-up impedance calibration operation described with reference to FIG. 7 and the resistance of the pull-up resistor of the pull-up resistor unit 1212, which is determined based on the pull-up code pu<n:1>, and determine a value of the pull-down code pd<p:1> through the pull-down impedance calibration operation. As a result, the resistance of the pull-down resistor of the pull-down resistor unit 1312 may be determined based on the determined pull-down code pd<p:1>. The pull-up impedance calibration operation described with reference to FIG. 7 and the pull-down calibration operation described with reference to FIG. 8 may be sequentially performed. In another embodiment, the pull-up impedance calibration operation described with reference to FIG. 7 and the pull-down calibration operation described with reference to FIG. 8 may be performed in parallel, e.g., at the same time.

Figure 9:
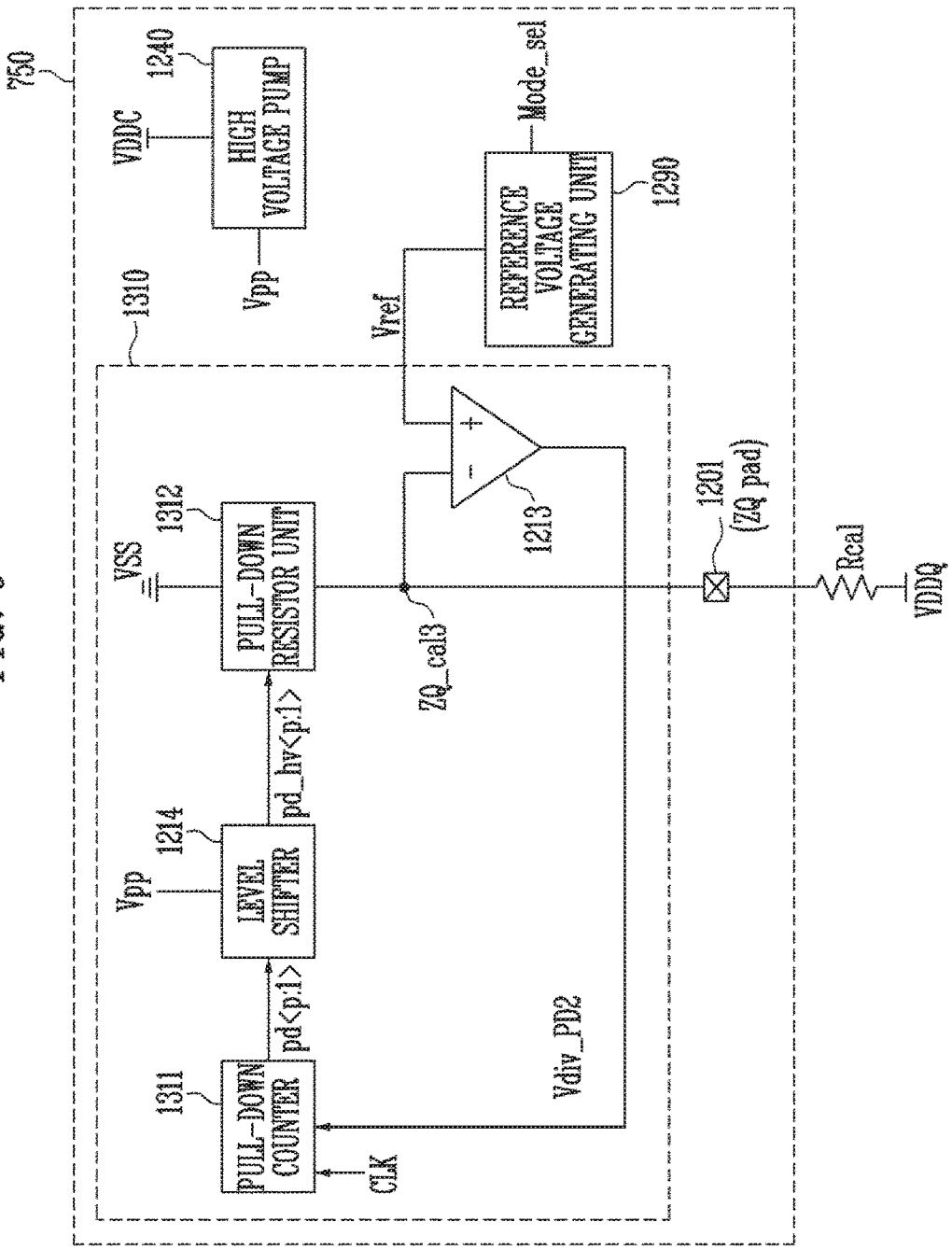
FIG. 9 is a diagram illustrating a pull-down impedance calibration operation in accordance with an embodiment of the present disclosure.

FIG. 9 is a diagram illustrating a pull-down impedance calibration operation in accordance with an embodiment of the present disclosure.

Referring to FIG. 9, the buffer memory device interface 750 of the memory controller 1200 may include a second pull-down impedance calibration circuit 1310 and a reference voltage generating unit 1290 for generating a reference voltage Vref. The second pull-down impedance calibration circuit 1310 may include a pull-down counter 1311 for generating a pull-down code pd<p:1> in response to the reference voltage Vref generated by the reference voltage generating unit 1290, a level shifter 1214 that increases a voltage swing of the pull-down code pd<p:1>, a pull-down resistor unit 1312 that changes the resistance of a pull-down resistor, and a comparator 1213.

A calibration resistor Rcal may be located at the outside of the memory controller 1200. One node of the calibration resistor Rcal may be coupled to the memory controller 1200 through a ZQ pad 1201 of the memory controller 1200. The other node of the calibration resistor Rcal may be coupled to the input/output power voltage VDDQ.

The pull-down impedance calibration operation to be described with reference to FIG. 9 has a termination direction different from that of the pull-up calibration operation described with reference to FIG. 7. In other words, one node of the calibration resistor Rcal of FIG. 7 may be coupled to the ground voltage VSS, and one node of the calibration resistor Rcal of FIG. 9 may be coupled to the input/output power voltage VDDQ. In an embodiment, when the buffer memory device 1300 uses the DDR4 DRAM as the DRAM 1305, the memory controller 1200 may perform a ZQ calibration operation through the calibration resistor Rcal terminated to the input/output power voltage VDDQ as shown in FIG. 9. In another embodiment, when the buffer memory device 1300 uses the LPDDR4 DRAM as the DRAM 1305, the memory controller 1200 may perform a ZQ calibration operation through the calibration resistor Rcal terminated to the ground voltage VSS as shown in FIG. 7. That the reference voltage Vref has different ranges as described with reference to FIG. 6 may result from different termination directions of the calibration resistor Rcal. In addition, that the reference voltage Vref has different ranges as described with reference to FIG. 6 may result from a difference between a case where one node of the calibration resistor Rcal Is coupled to the ground voltage VSS as shown in FIG. 7 and a case where one node of the calibration resistor Rcal is coupled to the input/output power voltage VDDQ as shown in FIG. 9.

The reference voltage generating unit 1290 may generate a reference voltage Vref for a ZQ calibration operation. The ZQ calibration operation may include a pull-down impedance calibration operation and a pull-up impedance calibration operation. The reference voltage generating unit 1290 may change the level of the reference voltage Vref in response to a mode selection signal Mode_sel. In an embodiment, when the buffer memory device 1300 uses the DDR4 DRAM as the DRAM 1305, the reference voltage generating unit 1290 may generate the reference voltage Vref having a level included in the first reference voltage range of FIG. 6. In another embodiment, when the buffer memory device 1300 uses the LPDDR4 DRAM as the DRAM 1305, the reference voltage generating unit 1290 may generate the reference voltage Vref having a level included in the second reference voltage range of FIG. 6. As described above, the reference voltage Vref may have different levels depending on the kind of the DRAM 1305 included in the buffer memory device 1300, and the reference voltage generating unit 1290 may vary the level of the reference voltage Vref in response to the mode selection signal Mode_sel. In an embodiment, when the buffer memory device 1300 uses the DDR4 DRAM as the DRAM 1305, the mode selection signal Mode_sel may be logic 'high.' When the buffer memory device 1300 uses the LPDDR4 DRAM as the DRAM 1305, the mode selection signal Mode_sel may be logic 'low.'

An external device of the memory controller 1200, e.g., the buffer memory device 1300 may use the reference voltage Vref generated by the memory controller 1200 in a data input operation. For example, the reference voltage Vref may be used as a reference for determining whether a data signal is logic 'high' or logic 'low' in a data input or output operation between the memory controller 1200 and the buffer memory device 1300.

The reference voltage Vref may be entered as one input of the comparator 1213, and another input of the comparator 1213 may be coupled to a third ZQ calibration node ZQ_cal3. The comparator 1213 may generate a second pull-down division voltage Vdiv_PD2 by comparing the reference voltage Vref with a voltage of the third ZQ calibration node ZQ_cal3.

The second pull-down division voltage Vdiv_PD2 and a clock signal CLK may be entered to the pull-down counter 1311. The pull-down counter 1311 may change a value of the pull-down code pd<p:1>, based on the second pull-down division voltage Vdiv_PD2. Also, the pull-down counter 1311 may change the value of the pull-down code pd<p:1> in synchronization with the clock signal CLK. At this time, the voltage swing of the pull-down code pd<p:1> may have the magnitude of the input/output power voltage VDDQ.

The level shifter 1214 may generate a high voltage pull-down code pd_hv<p:1> by increasing the magnitude of the voltage swing of the pull-down code pd<p:1>. As described above, the voltage swing of the pull-down code pd<p:1> may have the magnitude of the input/output power voltage VDDQ. The level shifter 1214 may increase the magnitude of the voltage swing of the pull-down code pd<p:1> from the input/output power voltage VDDQ to a high voltage Vpp. The high voltage Vpp may be a voltage higher than the input/output power voltage VDDQ. The high voltage Vpp may be generated by a high voltage pump 1240. The high voltage pump 1240 may generate the high voltage Vpp by pumping charges supplied from an internal power voltage VDDC. In other words, the high voltage pump 1240 may use the internal power voltage VDDC rather than the input/output power voltage VDDQ when a charge pumping operation is performed. As a result, the high voltage Vpp can be stably generated regardless of noise generated in the input/output power voltage VDDQ when a data input/output operation is performed. In addition, when the high voltage pump 1240 performs the charge pumping operation, noise in the internal power voltage VDDC generated when the charge pumping operation is performed using the internal power voltage VDDC rather than the input/output power voltage VDDQ may have no influence on the data input/output operation. In another embodiment, the pull-down code pd<p:1> received from the pull-down counter 1311 is not entered to the level shifter 1214 but is immediately entered to the pull-down resistor unit 1312.

The input/output power voltage VDDQ may be supplied from an external or host device to the memory controller 1200 through an input/output power voltage pad (VDDQ pad, not shown). In addition, the internal power voltage VDDC may be supplied from an external or host device to the memory controller 1200 through an internal power voltage pad (VDDC pad, not shown) different from the VDDQ pad. As the VDDQ pad through which the input/output power voltage VDDQ is supplied and the VDDC pad through which the internal power voltage VDDC is supplied are separated from each other, it is possible to minimize malfunction caused in an internal operation of the memory controller 1200 due to power noise generated in a data output operation of the memory controller 1200. In addition, it is possible to minimize malfunction caused in the data output operation of the memory controller 1200 due to power noise generated in the internal operation of the memory controller 1200.

The pull-down resistor unit 1312 may change the resistance of the pull-down resistor, based on a value of the high voltage pull-down code pd_hv<p:1>. If the resistance of the pull-down resistor varies, the voltage of the third ZQ calibration node ZQ_cal3 may also vary.

In an embodiment, when the voltage of the third ZQ calibration node ZQ_cal3 is lower than the reference voltage Vref, the pull-down counter 1311 may change the value of the pull-down code pd<p:1> in synchronization with the clock signal CLK such that the resistance of the pull-down resistor of the pull-down resistor unit 1312 increases. The pull-down resistor unit 1312 may increase the resistance of the pull-down resistor in response to the high voltage pull-down code pd_hv<p:1> received from the level shifter 1214. As a result, the voltage of the third ZQ calibration node ZQ_cal3 may increase.

In an embodiment, when the voltage of the third ZQ calibration node ZQ_cal3 is higher than the reference voltage Vref, the pull-down counter 1311 may change the value of the pull-down code pd<p:1> in synchronization with the clock signal CLK such that the resistance of the pull-down resistor of the pull-down resistor unit 1312 decreases. The pull-down resistor unit 1312 may decrease the resistance of the pull-down resistor in response to the value of the pull-down code pd<p:1>. As a result, the voltage of the third ZQ calibration node ZQ_cal3 may increase. In addition, the voltage of the third ZQ calibration node ZQ_cal3 may be changed depending on the resistance of the calibration resistor Rcal. In other words, the pull-down resistor unit 1312 may change the resistance of the pull-down resistor depending on the resistance of the calibration resistor Rcal. In an embodiment, when the reference voltage Vref has a level that is a half of the input/output power voltage VDDQ, the resistance of the pull-down resistor of the pull-down resistor unit 1312 may be set equal to that of the calibration resistor Rcal.

According to the pull-down impedance calibration operation described above, the voltage of the third ZQ calibration node ZQ_cal3 may be set equal to or substantially equal to the reference voltage Vref. The pull-down impedance calibration operation may be performed in a power-up operation. The pull-down impedance calibration operation may be performed in response to an external request. The pull-up impedance calibration operation may be performed in real time in a state in which the input/output power voltage VDDQ is applied. When the pull-up impedance calibration operation is performed in real time, it is possible to counteract, in real time, a change in input/output power voltage VDDQ, temperature, or the like.

Figure 10:
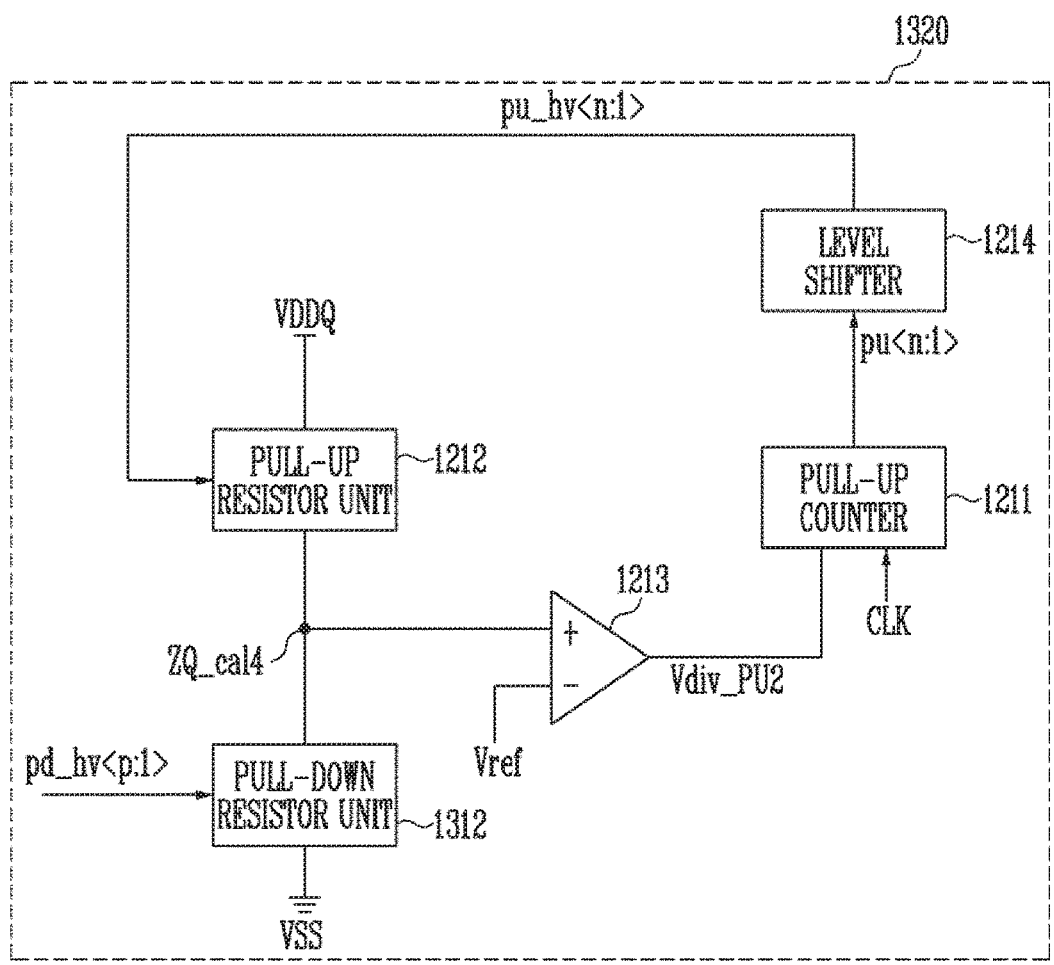
FIG. 10 is a diagram illustrating a pull-up impedance calibration operation in accordance with an embodiment of the present disclosure.

FIG. 10 is a diagram illustrating a pull-up impedance calibration operation in accordance with an embodiment of the present disclosure.

Referring to FIG. 10, the buffer memory device 750 of the memory controller 1200 may include a second pull-up impedance calibration circuit 1320. The memory controller 1200 may perform a pull-up impedance calibration operation, based on the high voltage pull-down code pd_hv<p:1> set by the pull-down impedance calibration operation described with reference to FIG. 9. In order to perform the pull-up impedance calibration operation, the second pull-up impedance calibration circuit 1320 may include the pull-down resistor unit 1312, the comparator 1213 configured to compare the reference voltage Vref with a voltage of a fourth ZQ calibration node ZQ_cal4, the pull-up counter 1211 configured to generate a pull-up code pu<n:1>, based on a second pull-up division voltage Vdiv_PU2 generated by the comparator 1213, the level shifter 1214 configured to increase the magnitude of a voltage swing of the pull-up code pu<n:1>, and the pull-up resistor unit 1212 configured to change the resistance of a pull-up resistor in response to a high voltage pull-up code pu_hv<n:1>.

The high voltage pull-down code pd_hv<p:1> of FIG. 10 may be a value determined through the pull-down impedance calibration operation described with reference to FIG. 9. Consequently, the resistance of the pull-down resistor of the pull-down resistor unit 1312, which is determined based on the high voltage pull-down code pd_hv<p:1>, may also be a value determined through the pull-down impedance calibration operation described with reference to FIG. 9. In addition, the reference voltage Vref of FIG. 10 may also be a voltage equal to the reference voltage Vref of FIG. 9. In another embodiment, instead of the high voltage pull-down code pd_hv<n:1>, the pull-down code pd<n:1> generated by the pull-down counter 1311 of FIG. 9 may be immediately entered to the pull-down resistor unit 1312 of FIG. 10.

In an embodiment, the pull-up resistor of the pull-up resistor unit 1212 may be a very large value before the pull-up calibration operation is started. In this case, the voltage of the fourth ZQ calibration node ZQ_cal4 may be a voltage lower than the reference voltage Vref. The comparator 1213 may generate a second pull-up division voltage Vdiv_PU2 by comparing the voltage of the fourth ZQ calibration node ZQ_cal4 with the reference voltage Vref, and the pull-up counter 1211 may generate a pull-up code pu<n:1> in response to the second pull-up division voltage Vdiv_PU2. The voltage swing of the pull-up code pu<n:1> may have the magnitude of an input/output power voltage VDDQ. At this time, the value of the pull-up code pu<n:1> may vary such that the resistance of the pull-up resistor of the pull-up resistor unit 1212 decreases.

The level shifter 1214 may generate a high voltage pull-up code pu_hv<n:1> by increasing the magnitude of the voltage swing of the pull-up code pu<n:1> from the input/output power voltage VDDQ to a high voltage Vpp. The high voltage Vpp may be a voltage higher than the input/output power voltage VDDQ. The high voltage Vpp may be generated by the high voltage pump 1240 of FIG. 9.

The pull-up resistor unit 1212 may change the resistance of the pull-up resistor, based on the high voltage pull-up code pu_hv<n:1> generated by the level shifter 1214. In the above-described example, the pull-up resistor unit 1212 may decrease the resistance of the pull-up resistor, based on the high voltage pull-up code pu_hv<n:1> generated by the level shifter 1214, thus increasing the voltage of the fourth ZQ calibration node ZQ_cal4.

In another embodiment, when the voltage of the fourth ZQ calibration node ZQ_cal4 is higher than the reference voltage Vref, the pull-up counter 1211 may change the pull-up code pu<n:1> to increase the resistance of the pull-up resistor of the pull-up resistor unit 1212. In addition, the pull-up resistor unit 1212 may increase the resistance of the pull-up resistor in response to the changed pull-up code pu<n:1>. As a result, the voltage of the fourth ZQ calibration node ZQ_cal4 may decrease. Consequently, the pull-up code pu<n:1> may be set to a code value that allows the voltage of the fourth ZQ calibration node ZQ_cal4 to be equal or substantially equal to the reference voltage Vref.

As described with reference to FIG. 9, the memory controller 1200 may determine the pull-down code pd<p:1>, based on the reference voltage Vref and the resistance of the calibration resistor Rcal, and the resistance of the pull-down resistor of the pull-down resistor unit 1312 may be determined based on the determined pull-down code pd<p:1>. Also, the memory controller 1200 may perform the pull-up impedance calibration operation, based on the pull-down code pd<p:1> determined through the pull-down impedance calibration operation described with reference to FIG. 9 and the resistance of the pull-down resistor of the pull-down resistor unit 1312, and determine a value of the pull-up code pu<n:1> through the pull-up impedance calibration operation. As a result, the resistance of the pull-up resistor of the pull-up resistor unit 1212 may be determined based on the determined pull-up code pu<n:1>. The pull-down impedance calibration operation described with reference to FIG. 9 and the pull-up calibration operation described with reference to FIG. 10 may be sequentially performed. In another embodiment, the pull-down impedance calibration operation described with reference to FIG. 9 and the pull-up calibration operation described with reference to FIG. 10 may be performed in parallel.

Figure 11:
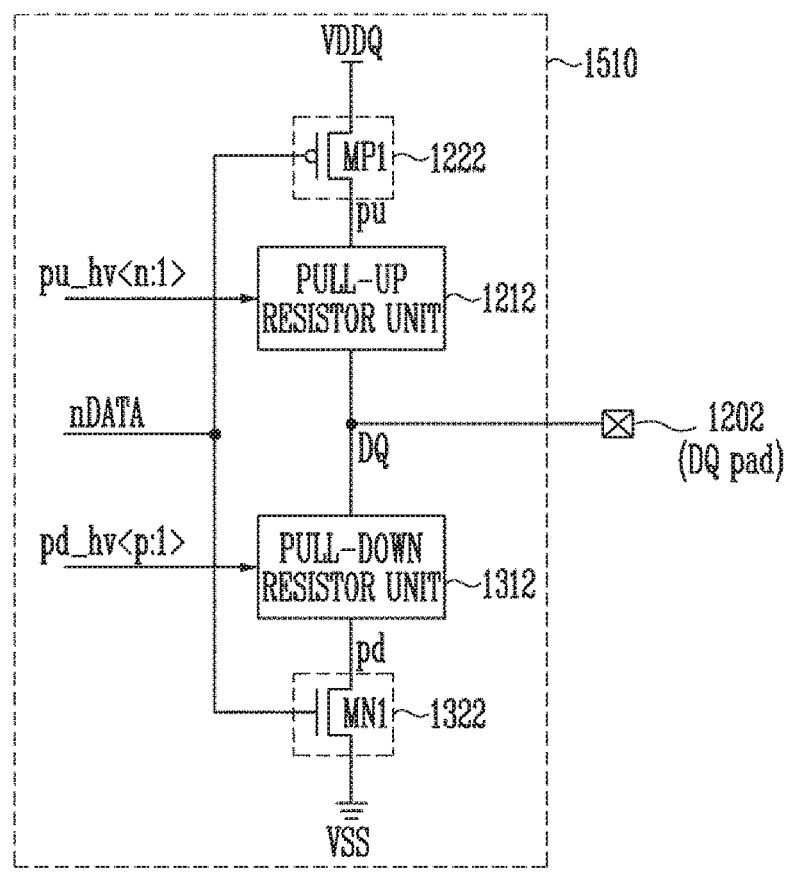
FIG. 11 is a diagram illustrating a data output driver in accordance with an embodiment of the present disclosure.

FIG. 11 is a diagram illustrating a data output driver in accordance with an embodiment of the present disclosure.

Referring to FIG. 11, the buffer memory device interface 750 of the memory controller 750 may include the data output driver 1510 to perform a data output operation. The data output driver 1510 may include a pull-up switching unit 1222 coupled to an input/output power voltage VDDQ, a pull-up resistor unit 1212 coupled between the pull-up switching unit 1222 and a DQ node DQ, a pull-down switching unit 1322 coupled to a ground voltage VSS, and a pull-down resistor unit 1312 coupled between the pull-down switching unit 1322 and the DQ node DQ. The DQ node DQ may be coupled to a DQ pad 1202.

When the calibration resistor Rcal is terminated to the ground voltage VSS as shown in FIG. 7, a high voltage pull-up code pu_hv<n:1> that is entered to the pull-up resistor unit 1212 to control the resistance of a pull-up resistor of the pull-up resistor unit 1212 may have a value determined through the pull-up impedance calibration operation of FIG. 7. In another embodiment, instead of the high voltage pull-up code pu_hv<n:1>, the pull-up code pu<n:1> generated by the pull-up counter 1211 of FIG. 7 may be entered to the pull-up resistor unit 1212 of FIG. 11. As described above, the resistance of the pull-up resistor of the pull-up resistor unit 1212 of the data output driver 1510 may be determined based on the pull-up code pu<n:1> determined through the ZQ calibration operation and the high voltage pull-up code pu_hv<n: 1>.

When the calibration resistor Rcal is terminated to the ground voltage VSS as shown in FIG. 7, a high voltage pull-down code pd_hv<p:1> that is entered to the pull-down resistor unit 1312 to control the resistance of a pull-down resistor of the pull-down resistor unit 1312 may be determined through the pull-down impedance calibration operation of FIG. 8. In another embodiment, instead of the high voltage pull-down code pd_hv<p:1>, the pull-down code pd<p:1> generated by the pull-down counter 1311 of FIG. 8 may be entered to the pull-down resistor unit 1312 of FIG. 11. As described above, the resistance of the pull-down resistor of the pull-down resistor unit 1312 of the data output driver 1510 may be determined based on the pull-down code pd<p:1> determined through the ZQ calibration operation and the high voltage pull-down code pd_hv<p:1>.

When the calibration resistor Rcal is terminated to the input/output power voltage VDDQ as shown in FIG. 9, the high voltage pull-down code pd_hv<p:1> that is entered to the pull-down resistor unit 1312 to control the resistance of the pull-down resistor of the pull-down resistor 1312 may have a value determined through the pull-down calibration operation of FIG. 9. In another embodiment, instead of the high voltage pull-down code pd_hv<p:1>, the pull-down code pd<p:1> generated by the pull-down counter 1311 may be entered to the pull-down resistor unit 1312 of FIG. 11. As described above, the resistance of the pull-down resistor of the pull-down resistor unit 1312 of the data output driver 1510 may be determined based on the pull-down code pd<p:1> determined through the ZQ calibration operation and the high voltage pull-down code pd_hv<p:1>.

When the calibration resistor Rcal is terminated to the input/output power voltage VDDQ as shown in FIG. 9, the high voltage pull-up code pu_hv<n:1> that is entered to the pull-up resistor unit 1212 to control the resistance of the pull-up resistor of the pull-up resistor unit 1212 may have a value determined through the pull-up impedance calibration operation of FIG. 10. In another embodiment, instead of the high voltage pull-up code pu_hv<n:1>, the pull-up code pu<n:1> generated by the pull-up counter 1211 of FIG. 10 may be entered to the pull-up resistor unit 1212 of FIG. 11. As described above, the resistance of the pull-up resistor of the pull-up resistor unit 1212 of the data output driver 1510 may be determined based on the pull-up code pu<n:1> determined through the ZQ calibration operation and the high voltage pull-up code pu_hv<n:1>.

A data bar signal nDATA is switched to be logic 'high' or logic 'low' according to a data signal output through the DQ pad 1202. In other words, the data bar signal nDATA is a signal that is switched at high speed to be logic 'high' or logic 'low' when a data output operation is performed at high speed. On the other hand, the pull-up code pu<n:1> and the high voltage pull-up code pu_hv<n:1> are not changed any more but may be fixed when the ZQ calibration operation is completed. In other words, the pull-up code pu<n:1> and the high voltage pull-up code pu_hv<n:1> are not changed while the data output operation is being performed but may maintain values determined through the ZQ calibration operation. Similarly, the pull-down code pd<p:1> and the high voltage pull-down code pd_hv<p:1> are not changed any more but may be fixed when the ZQ calibration operation is completed. In other words, the pull-down code pd<p:1> and the high voltage pull-down code pd_hv<p:1> are not changed while the data output operation is being performed but may maintain values determined through the ZQ calibration operation.

The pull-up switching unit 1222 may include a first PMOS transistor MP1. The first PMOS transistor MP1 of the pull-up switching unit 1222 may be turned on or turned off in response to switching of the data bar signal nDATA. The pull-down switching unit 1322 may include a first NMOS transistor MN1. The first NMOS transistor MN1 of the pull-down switching unit 1322 may be turned on or turned off in response to switching of the data bar signal nDATA.

The arrangement of the pull-up switching unit 1222 and the pull-up resistor unit 1212 may influence the performance of the data output operation. The magnitude of the capacitance of the DQ node DQ may influence the performance of the data output operation. In general, if the NMOS transistor is used when the same current driving capability, i.e., the same resistance of the pull-up resistor is implemented, the same resistance of the pull-up resistor may be implemented with the NMOS transistor having a size smaller than that of the PMOS transistor. For example, when the same resistance of the pull-up resistor is implemented with the NMOS transistor having a small size, the magnitude of the capacitance may be decreased. In other words, when the pull-up resistor of the pull-up resistor unit 1212 is implemented with the NMOS transistor, the magnitude of the capacitance of the DQ node DQ may be less than that when the pull-up resistor of the pull-up resistor unit 1212 is implemented with the PMOS transistor. Consequently, the performance of the data output operation can be improved. In addition, when the pull-up resistor of the pull-up resistor unit 1212 is implemented with the NMOS transistor, the capacitance of the pull-up resistor may be small as compared with the pull-up switching unit 1222 implemented with the PMOS transistor. Consequently, when the pull-up switching unit 1222 is coupled between the input/output power voltage VDDQ and a pull-up node pu and the pull-up resistor unit 1212 is coupled between the pull-up node pu and the DQ node DQ as shown in FIG. 11, the capacitance of the DQ node DQ can be less than that when the pull-up resistor unit 1212 is coupled to the input/output power voltage VDDQ and the pull-up switching unit 1222 is coupled between the pull-up resistor unit 1212 and the DQ node DQ. As a result, the performance of the data output operation can be improved.

When the pull-up resistor of the pull-up resistor unit 1212 is implemented with the NMOS transistor, it may not be easy to control the turn-on or turn-off of the NMOS transistor of the pull-up resistor unit 1212, using the pull-down code pd<p:1> having a voltage swing that has the magnitude of the input/output power voltage VDDQ. In this case, it may be difficult to control the resistance of the pull-up resistor of the pull-up resistor unit 1212. In other words, when the pull-up resistor of the pull-up resistor unit 1212 is implemented with the NMOS transistor, it may be easy to control the resistance of the pull-up resistor of the pull-up resistor unit 1212 when the NMOS transistor of the pull-up resistor unit 1212 is turned on or turned off using the high voltage pull-up code pu_hv<n:1> having a voltage swing that has the magnitude of the high voltage Vpp. As described above, since the high voltage pull-up code pu_hv<n:1> is not switched in the data output operation and maintains a fixed value, the high voltage pull-up code pu_hv<n:1> can be easily used even when the high voltage pull-up code pu_hv<n:1> has a high voltage swing.

The arrangement of the pull-down switching unit 1322 and the pull-down resistor unit 1312 may influence the performance of the data output operation. As described above, the magnitude of capacitance of the DQ node DQ may influence the performance of the data output operation. For example, the resistance of the pull-down resistor unit 1312 may be large as compared with the pull-down switching unit 1322. In other words, the pull-down switching unit 1322 may be implemented with a transistor having a large size as compared with the pull-down resistor unit 1312. Thus, when the pull-down switching unit 1322 is coupled between the ground voltage VSS and a pull-down node pd and the pull-down resistor unit 1312 is coupled between the pull-down switching unit 1322 and the DQ node DQ, the capacitance of the DQ node DQ can be less than that when the pull-down resistor unit 1312 is coupled between the ground voltage VSS and the pull-down node pd and the pull-down switching unit 1322 is coupled between the pull-down node pd and the DQ node DQ. As a result, the performance of the data output operation can be improved.

Figure 12:
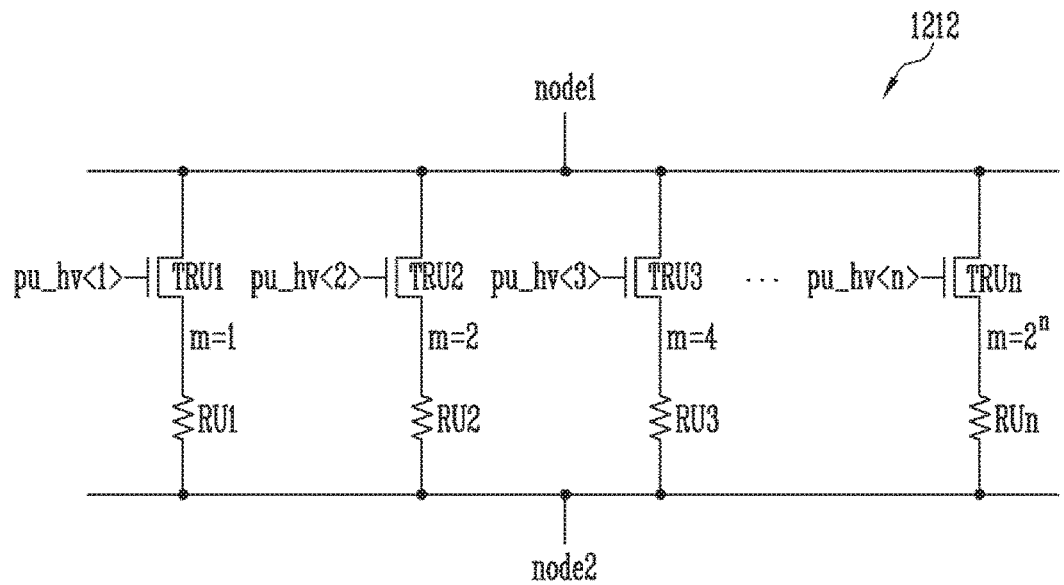
FIG. 12 is a diagram illustrating a pull-up resistor unit in accordance with an embodiment of the present disclosure.

FIG. 12 is a diagram illustrating a pull-up resistor unit in accordance with an embodiment of the present disclosure.

Referring to FIG. 12, the pull-up resistor unit 1212 may include a first to nth pull-up transistors TRU1 to TRUn. Bits of a high voltage pull-up code pu_hv<n:1> obtained by level-shifting a pull-up code pu<n:1> received from the pull-up counter 1211 may be entered to gate nodes of the first to nth pull-up transistors TRU1 to TRUn, respectively. In addition, the first to nth pull-up transistors TRU1 to TRUn may be coupled between a first node node1 and a second node node2. At this time, the first node node1 may be coupled to the input/output power voltage VDDQ in the cases of FIGS. 7, 8, and 10, and be coupled to the pull-up node pu in the case of FIG. 11. In addition, the second node node2 may be coupled to the first ZQ calibration node ZQ_cal1 in the case of FIG. 7, be coupled to the second ZQ calibration node ZQ_cal2 in the case of FIG. 8, be coupled to the fourth ZQ calibration node ZQ_cal4 in the case of FIG. 10, and be coupled to the DQ node DQ in the case of FIG. 11. Also, instead of the high voltage pull-up code pu_hv<n:1>, the pull-up code pu<n:1> received from the pull-up counter 1211 may be entered to the pull-up resistor unit 1212.

The transistors have different resistance values. Among the transistors, transistors may have resistance values that are two times, four times, eight times, . . . , i.e. $2^n$ times of the resistance value of a transistor to which the most significant bit pu_hv<n> of the high voltage pull-up code pu_hv<n:1> is entered. In other words, transistors may have sizes that are two times, four times, eight times, . . . , i.e., $2^n$ times of the size of a transistor to which the last significant bit pu_hv<1> of the high voltage pull-up code pu_hv<n:1> is entered. In an embodiment, the first pull-up transistor TRU1 to which the last significant bit pu_hv<1> of the high voltage pull-up code pu_hv<n:1> is entered may be configured with one transistor, and the second pull-up transistor TRU2 to which a second least significant bit pu_hv<2> of the high voltage pull-up code pu_hv<n:1> is entered may be configured with two transistor having the same size of the first pull-up transistor TRU1, which are coupled in parallel to each other. At this time, that the two transistors are coupled in parallel to each other means that source nodes of the two transistors are coupled to each other, drain nodes of the two transistors are coupled to each other, and gate nodes of the two transistors are coupled to each other (corresponding to m=2). In addition, the third pull-up transistor TRU3 to which a third least significant bit pu_hv<3> of the high voltage pull-up code pu_hv<n:1> is entered may be configured with four transistors having the same size of the first pull-up transistor TRU1, which are coupled in parallel to each other. That the sizes of the pull-up transistors TRU1 to TRUn are configured in this manner is called as that the sizes of the pull-up transistors TRU1 to TRUn are configured with a binary relationship. According to the above-described configuration, if logical values of the high voltage pull-up code pu_hv<n:1> vary by '1,' the pull-up resistor unit 1212 can decrease or increase resistance values in proportion to the variation.

Resistors may be coupled between the first to nth pull-up transistors TRU1 to TRUn and the second node node2, respectively. That is, a first pull-up constant resistor RU1 may be coupled between the first pull-up transistor TRU1 and the second node node2, a second pull-up constant resistor RU2 may be coupled between the second pull-up transistor TRU2 and the second node node2, a third pull-up constant transistor RU3 may be coupled between the third pull-up transistor TRU3 and the second node node2, and an nth pull-up constant resistor RUn may be coupled between the nth pull-up transistor TRUn and the second node node2.

Figure 13:
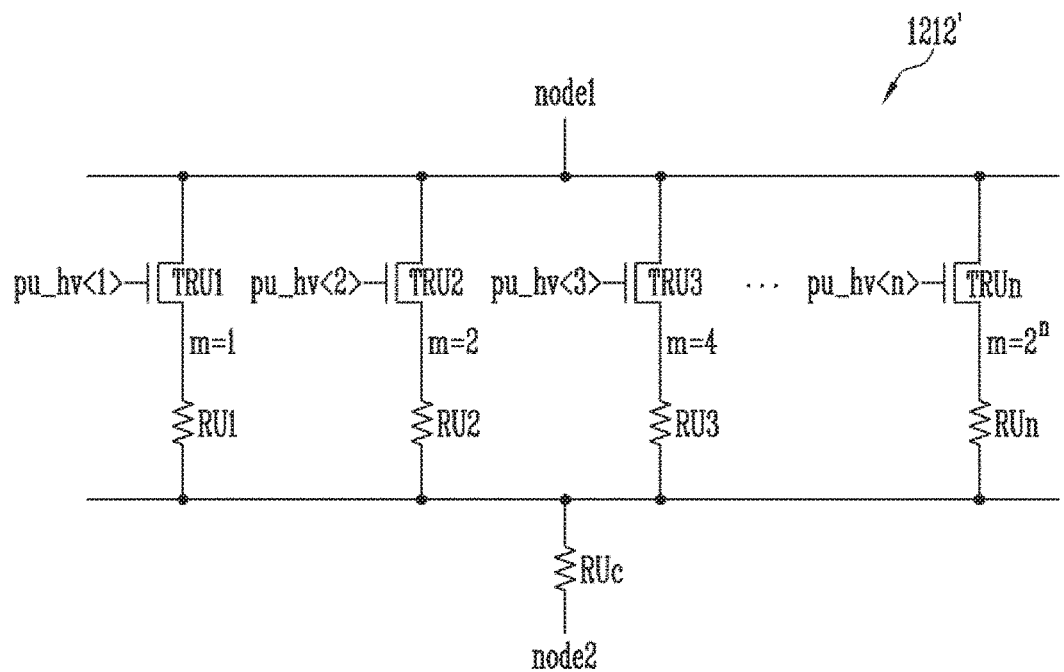
FIG. 13 is a diagram illustrating a pull-up resistor unit in accordance with an embodiment of the present disclosure.

FIG. 13 is a diagram illustrating a pull-up resistor unit in accordance with an embodiment of the present disclosure.

Referring to FIG. 13, unlike the embodiment of FIG. 12, the pull-up resistor unit 1212' may include a common pull-up constant resistor RUc commonly coupled to the source nodes of the first to nth pull-up transistors TRU1 to TRUn. Other contents are identical to those of the embodiment of FIG. 12, and therefore, their detailed descriptions will be omitted.

Figure 14:
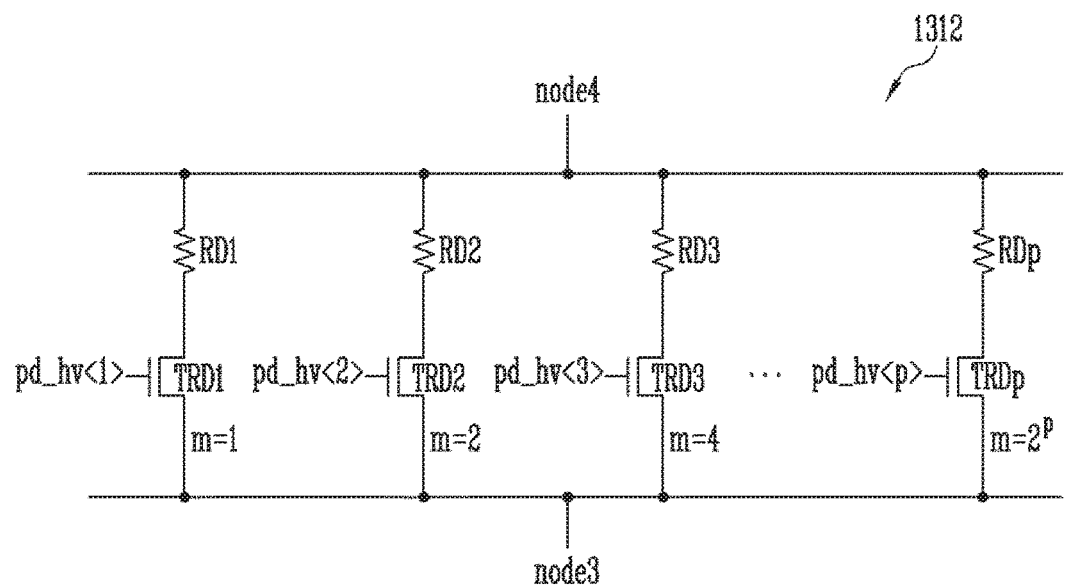
FIG. 14 is a diagram illustrating a pull-down resistor unit in accordance with an embodiment of the present disclosure.

FIG. 14 is a diagram illustrating a pull-down resistor unit in accordance with an embodiment of the present disclosure.

Referring to FIG. 14, the pull-down resistor unit 1312 may include a first to pth pull-down transistors TRD1 to TRDp. Bits of a high voltage pull-down code pd_hv<p:1> obtained by level-shifting a pull-down code pd<p:1> received from the pull-down counter 1311 may be entered to gate nodes of the first to nth pull-up transistors TRU1 to TRUn, respectively. In addition, the first to pth pull-down transistors TRD1 to TRDp may be coupled between a third node node3 and a fourth node node4. At this time, the third node node3 may be coupled to the ground voltage in the cases of FIGS. 7, 8, and 10, and be coupled to the pull-down node pd in the case of FIG. 11. In addition, the fourth node node4 may be coupled to the second ZQ calibration node ZQ_cal2 in the case of FIG. 8, be coupled to the third ZQ calibration node ZQ_cal3 in the case of FIG. 9, be coupled to the fourth ZQ calibration node ZQ_cal4 in the case of FIG. 10, and be coupled to the DQ node DQ in the case of FIG. 11. Also, instead of the high voltage pull-down code pd_hv<p:1>, the pull-down code pd<p:1> received from the pull-down counter 1311 may be entered to the pull-down resistor unit 1312. Here, p may be a natural number of 2 or more.

The transistors have different resistance values. Among the transistors, transistors may have resistance values that are two times, four times, eight times, . . . , i.e., $2^p$ times of the resistance value of a transistor to which the most significant bit pd_hv<p> of the high voltage pull-down code pd_hv<p:1> is entered. In other words, transistors may have sizes that are two times, four times, eight times, . . . , i.e. $2^p$ times of the size of a transistor to which the last significant bit pd_hv<1> of the high voltage pull-down code pd_hv<p:1> is entered. In an embodiment, the first pull-down transistor TRD1 to which the last significant bit pd_hv<1> of the high voltage pull-down code pd_hv<p:1> is entered may be configured with one transistor, and the second pull-down transistor TRD2 to which a second least significant bit pd_hv<2> of the high voltage pull-down code pd_hv<p:1> is entered may be configured with two transistor having the same size of the first pull-down transistor TRD1, which are coupled in parallel to each other. At this time, that the two transistors are coupled in parallel to each other means that source nodes of the two transistors are coupled to each other, drain nodes of the two transistors are coupled to each other, and gate nodes of the two transistors are coupled to each other (corresponding to m=2). In addition, the third pull-down transistor TRD3 to which a third least significant bit pd_hv<3> of the high voltage pull-down code pd_hv<p:1> is entered may be configured with four transistors having the same size of the first pull-down transistor TRD1, which are coupled in parallel to each other. When the sizes of the pull-down transistors TRD1 to TRDp are configured in this manner is referred to as a binary relationship. According to the above-described configuration, if logical values of the high voltage pull-down code pd_hv<p:1> vary by '1,' the pull-down resistor unit 1312 may decrease or increase resistance values in proportion to the variation.

Resistors may be coupled between the first to pth pull-down transistors TRD1 to TRDp and the fourth node node4, respectively. That is, a first pull-down constant resistor RD1 may be coupled between the first pull-down transistor TRD1 and the fourth node node4, a second pull-down constant resistor RD2 may be coupled between the second pull-down transistor TRD2 and the fourth node node4, a third pull-down constant transistor RD3 may be coupled between the third pull-down transistor TRD3 and the fourth node node4, and a pth pull-down constant resistor RDp may be coupled between the pth pull-down transistor TRDp and the fourth node node4.

Figure 15:
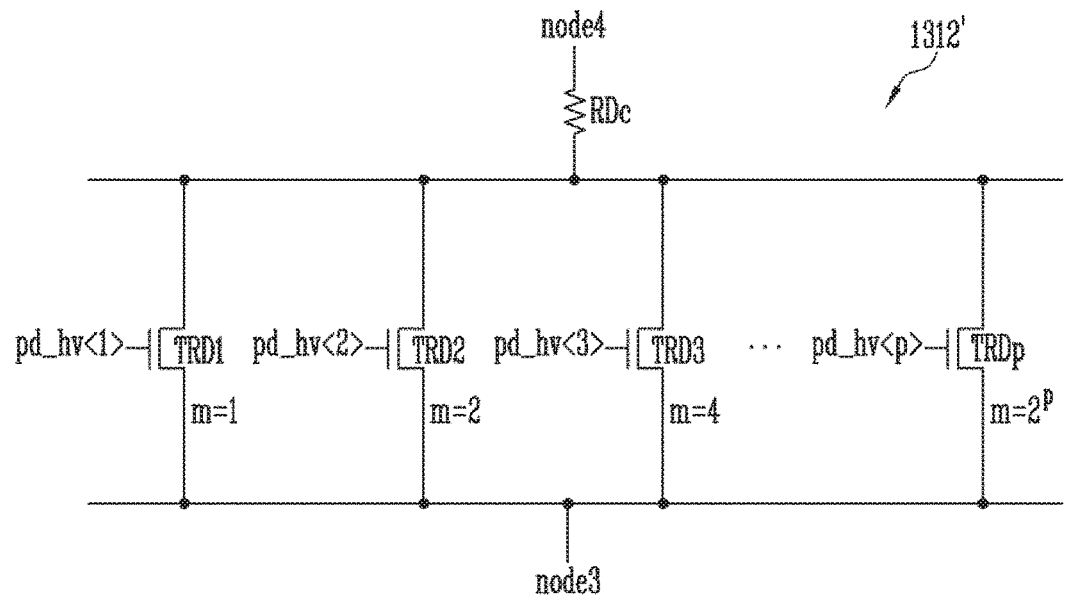
FIG. 15 is a diagram illustrating a pull-down resistor unit in accordance with an embodiment of the present disclosure.

FIG. 15 is a diagram illustrating a pull-down resistor, unit in accordance with an embodiment of the present disclosure.

Referring to FIG. 15, unlike the embodiment of FIG. 14, the pull-down resistor unit 1312' may include a common pull-down constant resistor RDc commonly coupled to the drain nodes of the first to pth pull-down transistors TRD1 to TRDp. Other contents are identical to those of the embodiment of FIG. 14, and therefore, their detailed descriptions will be omitted.

Figure 16:
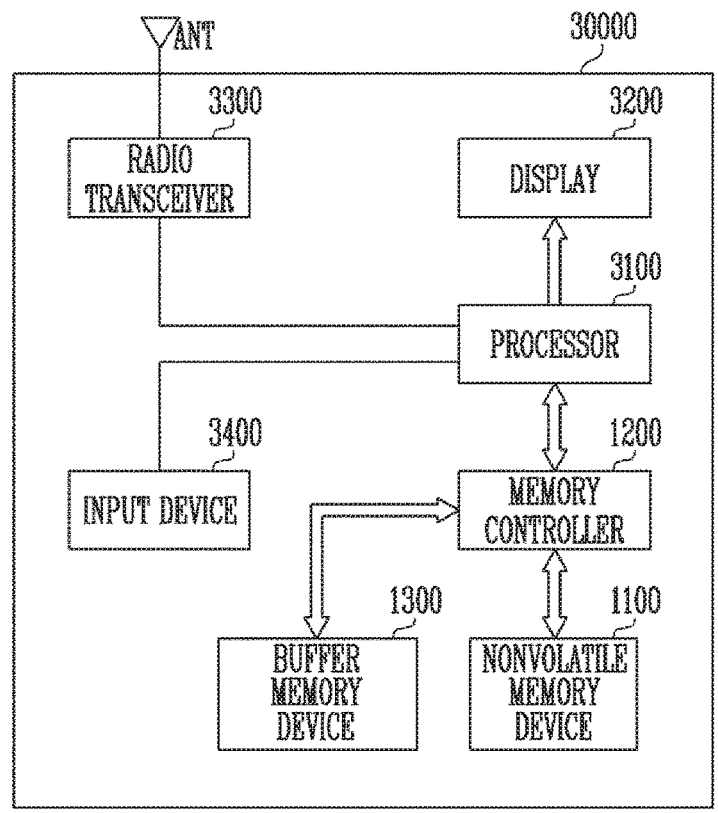
FIG. 16 is a diagram illustrating an embodiment of the memory system including the memory controller shown in FIG. 1.

FIG. 16 is a diagram illustrating another embodiment of the memory system including the memory controller shown in FIG. 1.

Referring to FIG. 16, the memory system 30000 may be implemented as a cellular phone, a smart phone, a tablet PC, a personal digital assistant (PDA), or a wireless communication device. The memory system 30000 may include a nonvolatile memory device 1100 and a memory controller 1200 capable of controlling an operation of the nonvolatile memory device 1100. The memory controller 1200 may control a data access operation of a buffer memory device 1300, e.g., a program operation, an erase operation, a read operation, or the like under the control of a processor 3100.

Data programmed in the nonvolatile memory device 1100 transmitted through a display 3200 under the control of the memory controller 1200.

A radio transceiver 3300 may transmit/receive radio signals through an antenna ANT. For example, the radio transceiver 3300 may convert a radio signal received through the antenna ANT into a signal that can be processed by the processor 3100. Therefore, the processor 3100 may process a signal received from the radio transceiver 3300 and transmit the processed signal to the memory controller 1200 or the display 3200. The memory controller 1200 may program the signal processed by the processor 3100 in the nonvolatile memory device 1100.

Also, the radio transceiver 3300 may convert a signal received from the processor 3100 into a radio signal, and output the converted radio signal to an external device through the antenna ANT. An input device 3400 is a device capable of inputting a control signal for controlling an operation of the processor 3100 or data to be processed by the processor 3100, and may be implemented as a pointing device such as a touch pad or a computer mouse, a keypad, or a keyboard. The processor 3100 may control an operation of the display 3200 such that data received from the memory controller 1200, data received from the radio transceiver 3300, or data received from the input device 3400 can be transmitted through the display 3200.

In some embodiments, the memory controller 1200 capable of controlling an operation of the nonvolatile memory device 1100 may be implemented as a part of the processor 3100, or be implemented as a chip separate from the processor 3100.

Figure 17:
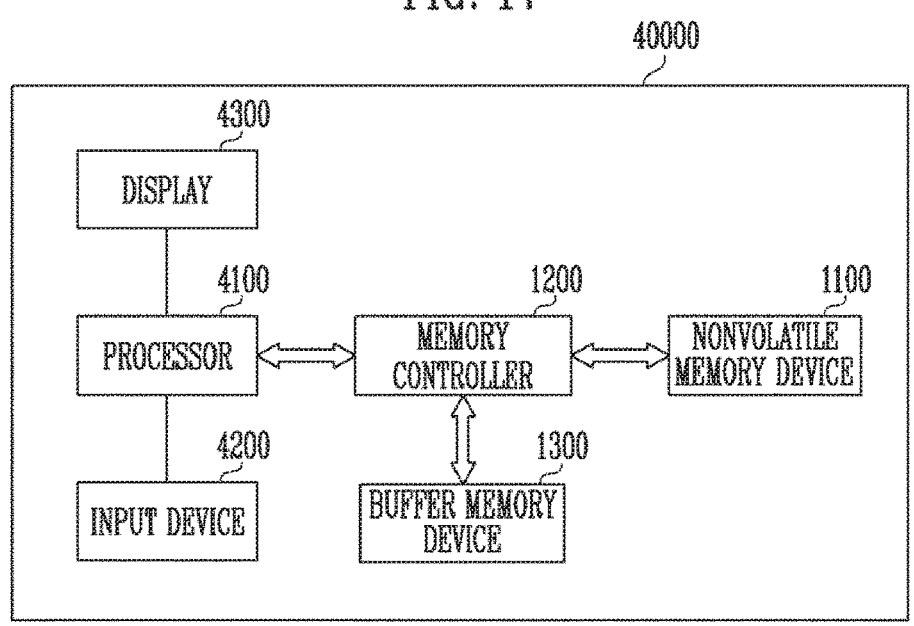
FIG. 17 is a diagram illustrating an embodiment of the memory system including the memory controller shown in FIG. 1.

FIG. 17 is a diagram illustrating another embodiment of the memory system including the memory controller shown in FIG. 1.

Referring to FIG. 17, the memory system 40000 may be implemented as a personal computer (PC), a tablet PC, a net-book, an e-reader, a personal digital assistant (PDA), a portable multimedia player (PMP), an MP3 player, or an MP4 player.

The memory system 40000 may include a nonvolatile memory device 1100 and a memory controller 1200 capable of controlling a data processing operation of the nonvolatile memory device 1100. The memory controller 1200 may control a data access operation of a buffer memory device 1300, e.g., a program operation, an erase operation, a read operation, or the like under the control of a processor 4100.

The processor 4100 may output data stored in the nonvolatile memory device 1100 through a display 4300 according to data entered through an input device 4200. For example, the input device 4200 may be implemented as a pointing device such as a touch pad or a computer mouse, a keypad, or a keyboard.

The processor 4100 may control overall operations of the memory system 40000, and control an operation of the memory controller 1200. In some embodiments, the memory controller 1200 capable of controlling an operation of the nonvolatile memory device 1100 may be implemented as a part of the processor 4100, or be implemented as a chip separate from the processor 4100.

Figure 18:
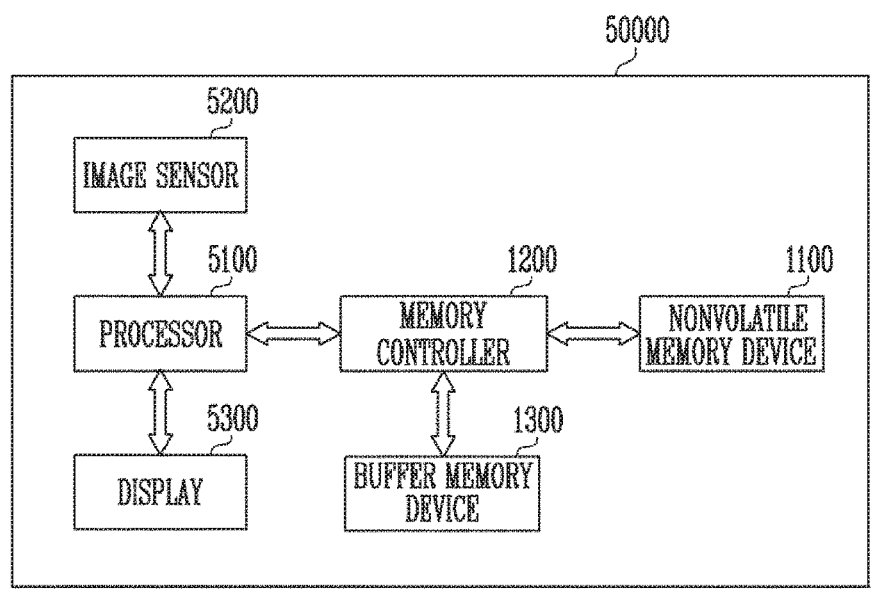
FIG. 18 is a diagram illustrating an embodiment of the memory system including the memory controller shown in FIG. 1.

FIG. 18 is a diagram illustrating another embodiment of the memory system including the memory controller shown in FIG. 1.

Referring to FIG. 18, the memory system 50000 may be implemented as an image processing device, e.g., a digital camera, a mobile terminal having a digital camera attached thereto, a smart phone having a digital camera attached thereto, or a tablet PC having a digital camera attached thereto.

The memory system 50000 may include a nonvolatile memory device 1100 and a memory controller 1200 capable of controlling a data processing operation of the nonvolatile memory device 1100, e.g., a program operation, an erase operation, or a read operation. The memory controller 1200 may control a data access operation of a buffer memory device 1300, e.g., a program operation, an erase operation, a read operation, or the like under the control of a processor 5100.

An image sensor 5200 of the memory system 50000 may convert an optical image into digital signals, and the converted digital signals may be transmitted to the processor 5100 or the memory controller 1200. Under the control of the processor 5100, the converted digital signals transmitted through a display 5300, or be stored in the nonvolatile memory device 1100 through the memory controller 1200. In addition, data stored in the nonvolatile memory device 1100 transmitted through the display 5300 under the control of the processor 5100 or the memory controller 1200.

In some embodiments, the nonvolatile memory controller 1200 capable of controlling an operation of the nonvolatile memory device 1100 may be implemented as a part of the processor 5100, or be implemented as a chip separate from the processor 5100.

Figure 19:
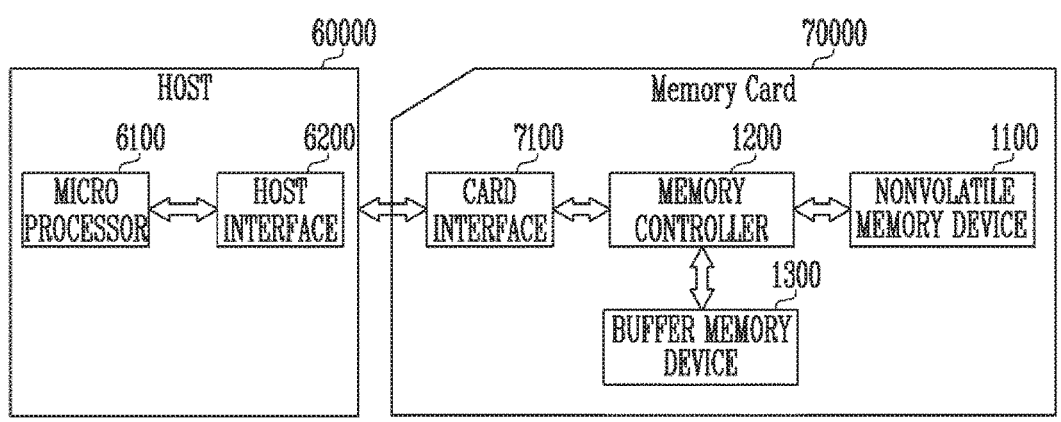
FIG. 19 is a diagram illustrating an embodiment of the memory system including the memory controller shown in FIG. 1.

FIG. 19 is a diagram illustrating another embodiment of the memory system including the memory controller shown in FIG. 1.

Referring to FIG. 19, the memory system 70000 may be implemented as a memory card or a smart card. The memory system 70000 may include a nonvolatile memory device 1100, a memory controller 1200, a card interface 7100 and a buffer memory device 1300.

The memory controller 1200 may control data exchange between the nonvolatile memory device 1100 and the card interface 7100. In some embodiments, the card interface 7100 may be a secure digital (SD) card interface or a multi-media card (MMC) interface, but the present disclosure is not limited thereto. The memory controller 1200 may control a data access operation of the buffer memory device 1300, e.g., a program operation, an erase operation, a read operation, or the like.

The card interface 7100 may interface data exchange between a host 60000 and the memory controller 1200 according to a protocol of the host 60000. In some embodiments, the card interface 7100 may support a universal serial bus (USB) protocol and an inter-chip (IC)-USB protocol. For example, the card interface 7100 may be or include hardware capable of supporting a protocol used by the host 60000, software embedded in the hardware, or a signal transmission scheme.

According to the present disclosure, the frequency of a data output operation can be improved by decreasing the capacitance of the data output driver.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A memory system comprising:
a buffer memory device; and
a memory controller including a data output driver configured to output data to the buffer memory device,
wherein the data output driver includes:
a pull-up switching unit coupled to an input/output power voltage, the pull-up switching unit including a PMOS transistor controlled by a data signal that varies according to the output data;
a pull-up resistor unit coupled to a DQ pad, the pull-up resistor unit including an NMOS transistor and a pull-up constant resistor coupled in series between the pull-up switching unit and the DQ pad;
a pull-down switching unit controlled by the data signal; and
a pull-down resistor unit coupled to the pull-down switching unit,
wherein the pull-up resistor unit controls the resistance of the pull-up resistor unit, based on a high voltage pull-up code.

2. The memory system of claim 1, wherein
the magnitude of a voltage swing of the high voltage pull-up code is greater than the input/output power voltage.

3. The memory system of claim 2, further comprising a calibration resistor terminated to a ground voltage,
wherein the memory controller further includes a pull-up impedance calibration circuit configured to generate the high voltage pull-up code, based on the resistance of the calibration resistor.

4. The memory system of claim 3, further comprising a reference voltage generating unit configured to change the level of a reference voltage, based on a mode selection signal,
wherein the pull-up impedance calibration circuit generates the high voltage pull-up code, based on the reference voltage.

5. The memory system of claim 3, wherein the memory controller further includes a pull-down impedance calibration circuit configured to generate a pull-down code, based on the high voltage pull-up code,
wherein the pull-down resistor unit controls the resistance of a pull-down resistor, based on the pull-down code.

6. The memory system of claim 3, wherein the memory controller further includes:
a high voltage pump configured to generate a high voltage by pumping charges supplied from an internal power voltage; and
a level shifter configured to change a pull-up code to the high voltage pull-up code, based on the high voltage.

7. The memory system of claim 6, wherein the internal power voltage is supplied from an external or host device through an internal power voltage pad, and
the input/output power voltage is supplied from an external or host device through an input/output power voltage pad.

8. The memory system of claim 2, further comprising a calibration resistor terminated to the input/output power voltage,
wherein the memory controller further includes a pull-down impedance calibration circuit configured to generate a pull-down code, based on the calibration resistor and a reference voltage, and
wherein the pull-down resistor unit controls the resistance of a pull-down resistor, based on the pull-down code.

9. The memory system of claim 8, wherein the memory controller further includes a pull-up impedance calibration circuit configured to generate the high voltage pull-up code, based on the pull-down code and the reference voltage.

10. A memory system comprising:
a buffer memory device including at least one DRAM; and
a memory controller,
wherein the memory controller includes:
a data output driver configured to output data to the DRAM;

a reference voltage generating unit configured to generate a reference voltage and change the level of the reference voltage, based on a mode selection signal; and a pull-up calibration circuit configured to generate a high voltage pull-up code, based on the reference voltage, wherein the data output driver includes:

a pull-up switching unit coupled to an input/output power voltage, the pull-up switching unit including a PMOS transistor controlled by a data signal that varies according to data;

a pull-up resistor unit including a plurality of NMOS transistors and a plurality of pull-up constant resistors, each of the plurality of NMOS transistors being coupled to a corresponding one of the plurality of pull-up constant resistors in series between a DQ pad and the pull-up switching unit, the pull-up resistor unit determining whether each of the plurality of NMOS transistors is turned on, based on the high voltage pull-up code;

a pull-down switching unit controlled by the data signal; and a pull-down resistor unit coupled to the pull-down switching unit.

11. The memory system of claim 10, wherein the memory controller further includes:

a high voltage pump configured to generate a high voltage; and a level shifter configured to change a pull-up code to the high voltage pull-up code, based on the high voltage, wherein the high voltage is higher than the input/output power voltage.

12. The memory system of claim 11, wherein the high voltage pump generates the high voltage by pumping charges supplied from an internal power voltage, the internal power voltage is supplied from an external or host device through an internal power voltage pad, and the input/output power voltage is supplied from an external or host device through an input/output power voltage pad.

13. The memory system of claim 10, further comprising a calibration resistor terminated to a ground voltage, wherein the pull-up calibration circuit is coupled to the calibration resistor through a ZQ pad, and the high voltage pull-up code is determined based on the resistance of the calibration resistor.

14. The memory system of claim 13, wherein the reference voltage has a level lower than that of a half of the input/output power voltage.

15. The memory system of claim 10, further comprising a pull-down impedance calibration circuit configured to generate a pull-down code, based on the high voltage pull-up code, wherein the pull-down resistor unit controls the resistance of a pull-down resistor, based on the pull-down code.

16. A data output driver comprising:

a pull-up switching unit coupled to an input/output power voltage, the pull-up switching unit including a PMOS transistor controlled by a data signal that varies according to data;

a pull-up resistor unit including a plurality of NMOS transistors and a plurality of pull-up constant resistors, each of the plurality of NMOS transistors being coupled to a corresponding one of the plurality of pull-up constant resistors in series between a DQ pad and the pull-up switching unit;

a pull-down switching unit controlled by the data signal; and a pull-down resistor unit coupled to the pull-down switching unit.

17. The data output driver of claim 16, wherein the pull-up resistor unit controls the resistance of a pull-up resistor, based on a high voltage pull-up code, and a voltage swing of the high voltage pull-up code is greater than the input/output power voltage.

18. The data output driver of claim 16, further comprising at least one resistor coupled between the pull-up resistor unit and the DQ pad.

19. The data output driver of claim 16, wherein the plurality of NMOS transistors are configured with first to nth NMOS transistors (n is a natural number of 2 or more), and the sizes of the first to nth NMOS transistors are configured with a binary relationship.

* * * * *